US009768301B2

(12) United States Patent
Peng et al.

(10) Patent No.: US 9,768,301 B2
(45) Date of Patent: Sep. 19, 2017

(54) SHORT CHANNEL EFFECT SUPPRESSION

(71) Applicant: Taiwan Semiconductor Manufacturing Company, Ltd., Hsin-Chu (TW)

(72) Inventors: Cheng-Yi Peng, Hsinchu (TW); Chia-Cheng Ho, Hsinchu (TW); Chih-Sheng Chang, Hsinchu (TW); Yee-Chia Yeo, Hsinchu (TW); Yu-Lin Yang, Baoshan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/857,610

(22) Filed: Sep. 17, 2015

(65) Prior Publication Data
US 2016/0181245 A1    Jun. 23, 2016

Related U.S. Application Data

(63) Continuation-in-part of application No. 14/581,905, filed on Dec. 23, 2014.

(51) Int. Cl.
  *H01L 29/78* (2006.01)
  *H01L 27/092* (2006.01)
  (Continued)

(52) U.S. Cl.
  CPC .. *H01L 29/7849* (2013.01); *H01L 21/823807* (2013.01); *H01L 21/823821* (2013.01);
  (Continued)

(58) Field of Classification Search
  CPC ..... H01L 21/823431; H01L 21/823821; H01L 27/0924; H01L 27/0886; H01L 27/1211; H01L 29/785
  See application file for complete search history.

(56) References Cited

U.S. PATENT DOCUMENTS 6,497,171 B2 *  12/2002  Gerber ................... F41A 27/28
                                                    89/41.02
7,425,740 B2     9/2008   Liu et al.
(Continued)

FOREIGN PATENT DOCUMENTS

JP        2002-217413        8/2002

*Primary Examiner* — Shaun Campbell
*Assistant Examiner* — Aaron Dehne
(74) *Attorney, Agent, or Firm* — Haynes and Boone, LLP

(57) ABSTRACT

A semiconductor device includes a semiconductor substrate having a first region and a second region. The first region includes a first set of fin structures, the first set of fin structures comprising a first set of epitaxial anti-punch-through features of a first conductivity type. The first region further includes a first set of transistors formed over the first set of fin structures. The second region includes a second set of fin structures, the second set of fin structures comprising a second set of epitaxial anti-punch-through features of a second conductivity type opposite to the first conductivity type. The second region further includes a second set of transistors formed over the second set of fin structures. The first set of epitaxial anti-punch-through features and the second set of epitaxial anti-punch-through features are substantially co-planar.

20 Claims, 19 Drawing Sheets

(51) Int. Cl.
    *H01L 29/06*     (2006.01)
    *H01L 29/66*     (2006.01)
    *H01L 21/8238*     (2006.01)
    *H01L 29/16*     (2006.01)
    *H01L 29/161*     (2006.01)

(52) U.S. Cl.
    CPC .. *H01L 21/823892* (2013.01); *H01L 27/0924* (2013.01); *H01L 29/0638* (2013.01); *H01L 29/0653* (2013.01); *H01L 29/16* (2013.01); *H01L 29/161* (2013.01); *H01L 29/66537* (2013.01)

(56) References Cited

U.S. PATENT DOCUMENTS

| | | | |
|---|---|---|---|
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,171 B1 | 7/2013 | Wu et al. | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2007/0221956 A1 | 9/2007 | Inaba | |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2014/0374840 A1* | 12/2014 | Lee | H01L 27/0886 257/401 |
| 2016/0049402 A1* | 2/2016 | Liu | H01L 27/0924 257/369 |
| 2016/0064288 A1* | 3/2016 | Cheng | H01L 29/165 257/192 |

\* cited by examiner

SHORT CHANNEL EFFECT SUPPRESSION

PRIORITY INFORMATION

This patent application is a continuation-in-part of U.S. patent application Ser. No. 14/581,905 filed Dec. 23, 2014 and entitled "Short Channel Effect Suppression," the disclosure of which is hereby incorporated by reference in the entirety.

BACKGROUND

Fabrication of integrated circuits involves forming large numbers of very small devices on a single wafer. As fabrication technologies improve, the devices become smaller such that more devices can fit within a smaller amount of space. A commonly formed device is a transistor. A transistor generally includes a gate terminal, a source terminal, and a drain terminal. A channel is positioned below the gate and between the source and drain terminals. Based on the signal applied to the gate, electric current is allowed or prevented from flowing through the channel.

As transistors are formed with smaller sizes, the channels of such devices also become smaller. Smaller channels may present a variety of issues, which are often referred to as the short channel effect. For example, a short channel may allow for current to inadvertently flow between the source and the drain based on voltage differential between the source and drain. To avoid this issue, anti-punch-through features can be formed at or near the bottom of a channel. It is desirable to form such anti-punch-through channels in a manner that maximizes their efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
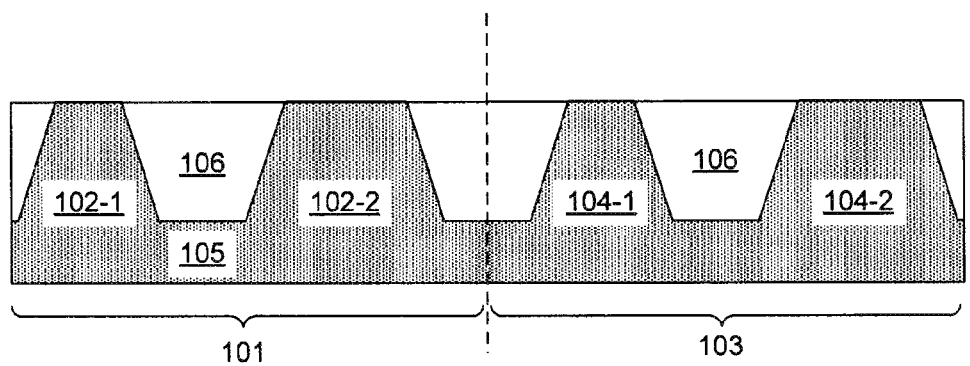
FIGS. 1A-1G are diagrams showing an illustrative process for forming devices with anti-punch-through features at varying depths, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, anti-punch-through features can be formed at or near the bottom of a channel to help reduce the short channel effects. It is desirable to form such anti-punch-through features in a manner that maximizes their efficiency. Particularly, different transistors within the same circuit often have different sizes. F-type transistors can particularly benefit from methods and structures that increase the efficiency of operation.

According to principles described herein, the anti-punch-through features of the p-type transistors can be formed at varying depths, the varying depths being based on the size of each respective transistor. In one example, this may be done by forming the anti-punch-through features of the p-type transistors before forming the channel. The following provides a detailed discussion of devices with anti-punch-through features with varying depths, as well as methods of fabricating such devices.

FIGS. 1A-1G are diagrams showing an illustrative process for forming devices with anti-punch-through features at varying depths. FIG. 1A illustrates the formation of several semiconductor features 102, 104 formed around isolation structures 106. Specifically, in an n-type region 101, a first set of semiconductor features 102 is formed. The semiconductor features of the first set will ultimately be used for n-type transistors. In a p-type region 103, a second set of semiconductor features 104 is formed. The semiconductor features of the second set will ultimately be used for p-type transistors.

In one example, the semiconductor features 102, 104 are formed by creating isolation structures 106 around the features. An isolation structure 106 may be, for example, a Shallow Trench Isolation (STI) structure. Such structures are created by etching trenches within a semiconductor substrate 105. Then, the trenches can be filled with an isolation material, such as a dielectric material. Then, a planarizing process such as a Chemical Mechanical Polishing (CMP) process is performed to create a flat surface and remove any excess material.

The semiconductor features 102 within the n-type region 101 may be referred to as n-type features because the semiconductor material therein is doped appropriately to form an n-type transistor. Specifically, the semiconductor material is doped with a p-type dopant such as boron. Similarly, the semiconductor features 104 within the p-type region 103 may be referred to as p-type features because they will ultimately be doped appropriately to form a p-type transistor. Specifically, they will be doped with an n-type dopant such as phosphorous.

In various semiconductor devices, different transistors may have different sizes. According to the present example, a first n-type feature 102-1 within the n-type region 101 is smaller than a second n-type feature 102-2 in the n-type region 101. Likewise, a first p-type feature 104-1 within the p-type region 103 is smaller than a second p-type feature 104-2 in the p-type region 103.

Figure 1B:
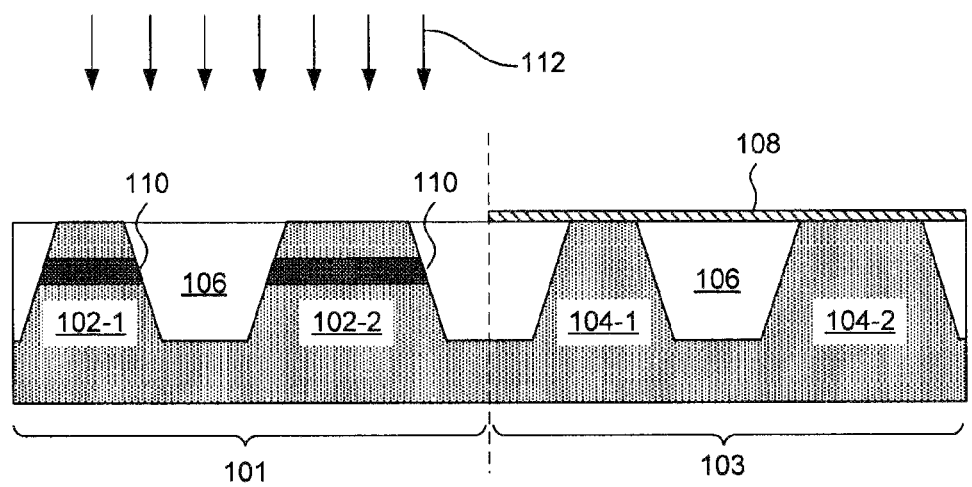

FIG. 1B is a diagram showing formation of anti-punch-through features 110 in the n-type region 101. According to the present example, before applying fabrication processes to the n-type region, the p-type region is covered with a mask layer 108. The mask layer may be, for example, an oxide layer. Other materials may be used as well, including silicon nitride, silicon oxynitride, a combination thereof, or any other suitable dielectric material. The mask layer 108 may be applied evenly across the wafer. Then, using various photolithographic techniques, the mask layer 108 over the n-type region 101 is removed, while leaving the mask layer 108 over the p-type region 103 substantially intact. For example, a photoresist layer may be deposited over the mask. Then, the photoresist layer may be exposed to a light source through use of a patterned photomask. The patterned photomask is such that the desired pattern is applied to the photoresist layer such that portions intended to be removed are dissolvable to a developing solution. Then, an etching process can be used to remove the exposed portions of the mask layer 108.

After the mask layer 108 is patterned to expose the n-type region, an implanting process 112 can be used to form anti-punch-through features 110 in the n-type region. The implanting process 112 can be tuned such that the anti-punch-through features 110 are formed at a particular depth below the surface of the n-type features 102-1. In one example, the anti-punch-through features 110 are formed at a depth such that a bottom of the anti-punch-through features 110 are within a range of about 30-50 nanometers below the surface. This can be done by adjusting the electric field used in the ion implanting process. Ion implantation utilizes an electric field to accelerate ions towards a surface. By setting the strength of the electric field appropriately, the ions can lodge near a specific point below the surface. The approximate thickness of the anti-punch-through features 110 may be within a range of about 5-10 nanometers. The implanting process 112 implants a p-type dopant, such as boron, but at a higher concentration than the rest of the features 102, which are already doped with a p-type dopant. In one example, the concentration of the p-type dopant for the anti-punch-through feature is within a range of about $1\times10^{17}/cm^3$-$1\times10^{18}/cm^3$. The dopant concentration of the channel region above the anti-punch-through features may be within a range of about $1\times10^{15}/cm^3$-$1\times10^{16}/cm^3$. The implanting process 112 is such that each of the anti-punch-through features 110 is at a substantially similar depth. This is so despite the variation in size between the various features 102. In some examples, a Rapid Thermal Annealing (RTA) process is performed after the implanting process 112. An RTA process involves exposing the substrate to high temperatures.

Figure 1C:
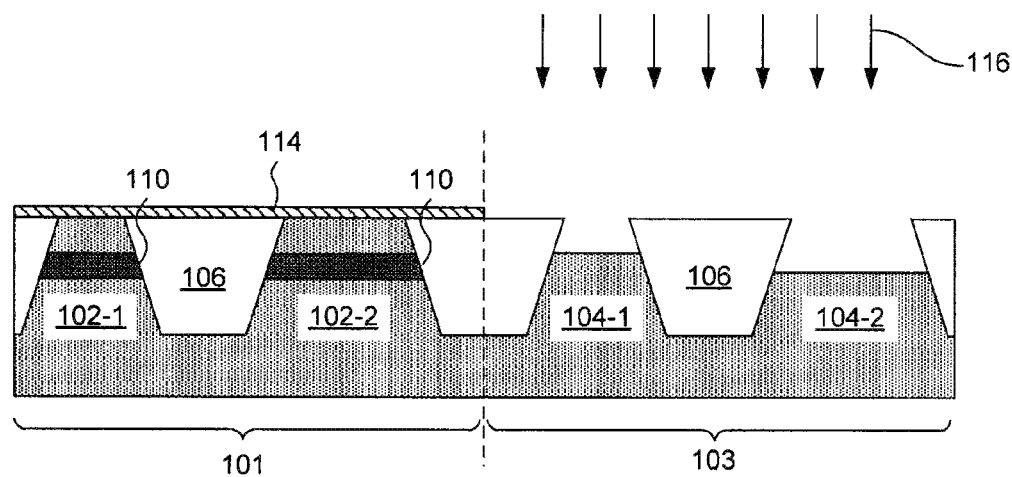

FIG. 1C is a diagram showing an illustrative etching process 116 performed on the p-type region 103. According to the present example, the mask layer 108 is removed and a second mask layer 114 is applied. The second mask layer 114 is then patterned such that it covers the n-type region 101 and exposes the p-type region 103. The mask layer 114 may also be made of an oxide material or other material as described above regarding mask 108, and may be patterned using various photolithographic techniques.

The etching process 116 is designed to remove exposed semiconductor material while leaving the isolation structures 106 substantially intact. The etching process may be, for example, a dry etching process. Due to the loading effect, the features 104 that are larger will be etched more quickly than the smaller features 104. Specifically, because the second p-type feature 104-2 is larger than the first p-type feature 104-1, the second p-type feature 104-2 will be etched deeper than the first p-type feature 104-1.

Figure 1D:
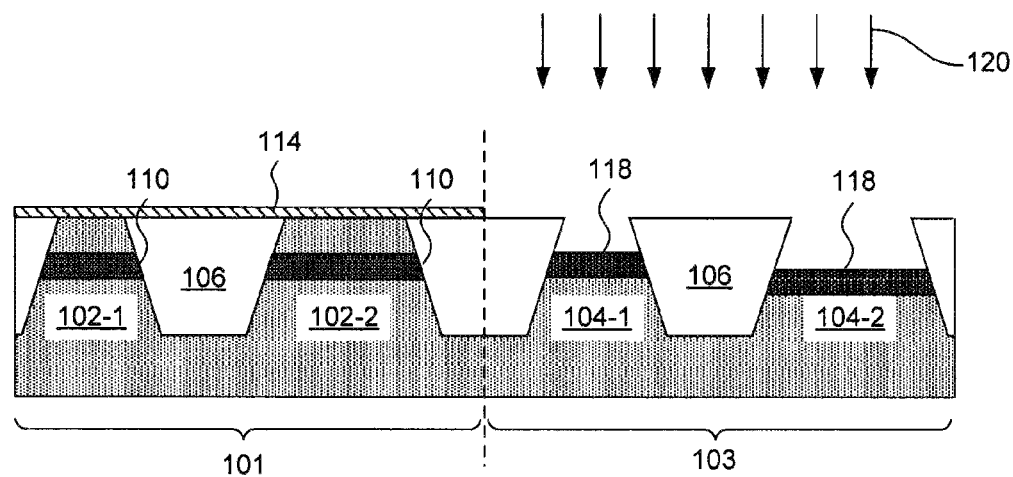

FIG. 1D is a diagram showing an illustrative implanting process 120 to form the anti-punch-through features 118 for the p-type region 103. In one example, the formation process is an implanting process. The implanting process occurs after the etching process 116 described in the text accompanying FIG. 1C. The implanting process 120 uses an n-type dopant, such as phosphorous, arsenic, or antimony, to create a higher doping concentration than that of the channel material, the formation of which will be described below. The implanting process 120 is tuned, for example by adjusting bias power, such that the anti-punch-through features 118 are formed on the surface of the features 104. Other methods of forming the anti-punch-through features 118 may be used as well. For example, a diffusion process using either a gas source or solid source may be used. In one example, the anti-punch-through features 118 may be formed through an epitaxial growth process with in-situ doping. Because the surfaces of the features 104 are at varying levels, the anti-punch-through features 118 are also formed at different levels. Specifically, larger features will have deeper anti-punch-through features 118. Conversely, smaller features will have shallower anti-punch-through features 118.

The anti-punch-through features 118 may be formed to have a thickness within a range of about 5-10 nanometers extending from the surface of the features 104. In one example, the concentration of the n-type dopant for the anti-punch-through features 118 is within a range of about $1\times10^{17}/cm^3$-$1\times10^{18}/cm^3$. The dopant concentration is greater than that of the channel material that will be formed as described below. After the anti-punch-through features have been formed, an annealing process such as an RTA process may be performed.

Figure 1E:
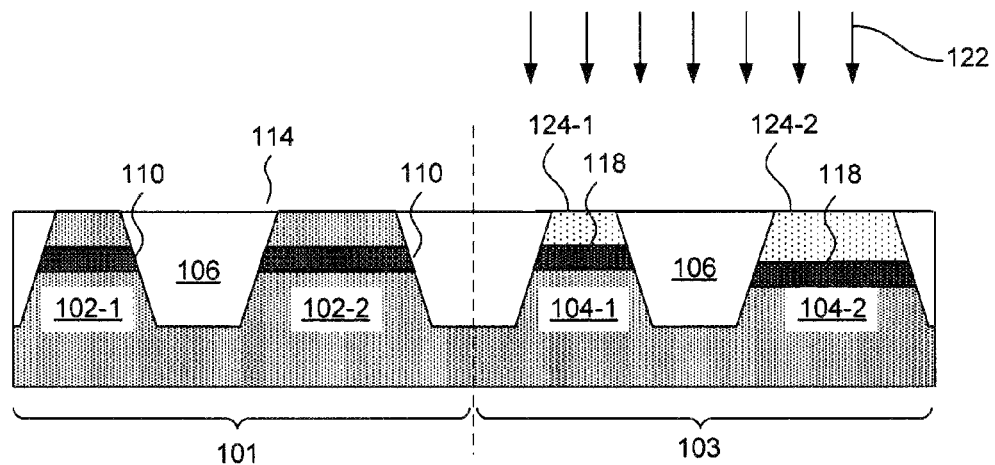

FIG. 1E is a diagram showing a formation process 122 to form a semiconductor layer 124 on top of the anti-punch-through features 118. The semiconductor layer 124 may be a semiconductor material that is designed for use as a channel material for a p-type device. Thus, the semiconductor layer is doped with an n-type dopant. The doping concentration may be within a range of about $1\times10^{15}/cm^3$-

$1\times10^{16}/cm^3$. In one example, the semiconductor layer 124 may be formed using an epitaxial growth process. The semiconductor layer 124 may also be doped in-situ. In one example, the semiconductor layer 124 may be silicon germanium, or another germanium based semiconductor layer. The ratio of silicon to germanium may be within a range of 1:0.1-0.9. Because the first feature 104-1 has a smaller width than the second feature 104-2, the semiconductor layer 124-1 formed on the first p-type feature 104-1 also has a smaller width than the semiconductor layer 124-2 formed on the second p-type feature 104-2. After the semiconductor layer 124 is formed, the mask layer 114 covering the n-type region may be removed. Additionally, a CMP process may be performed to planarize the surface of the wafer.

Figure 1F:
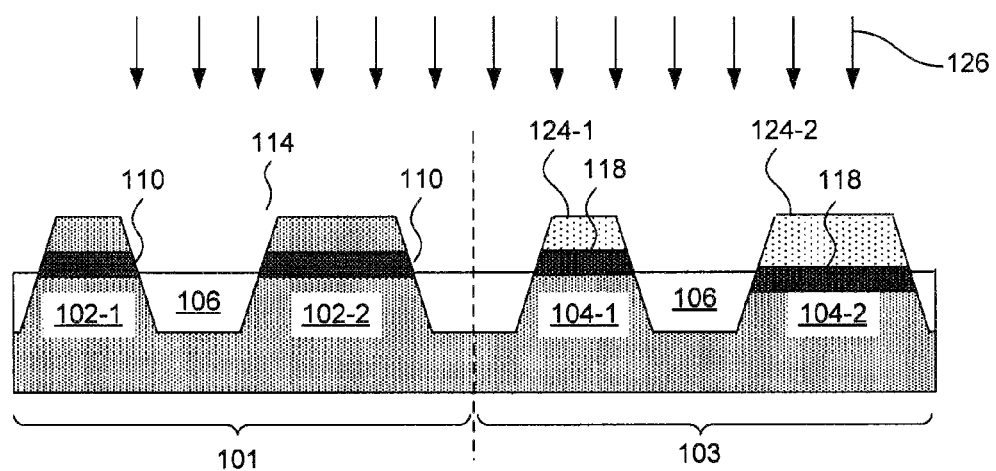

FIG. 1F is a diagram showing an illustrative finFET (fin Field Effect Transistor) formation process. This is done by performing an etching process 126 to remove portions of the isolation structures 106. The etching process 126 is selective such that the material forming the isolation structures is removed while the remaining features 102, 104 are left substantially intact. The result is that the features 102, 104 now protrude from the surface of the isolation structures to form fin-like shapes. Such fin-like shapes can provide a number of benefits to transistors.

Figure 1G:
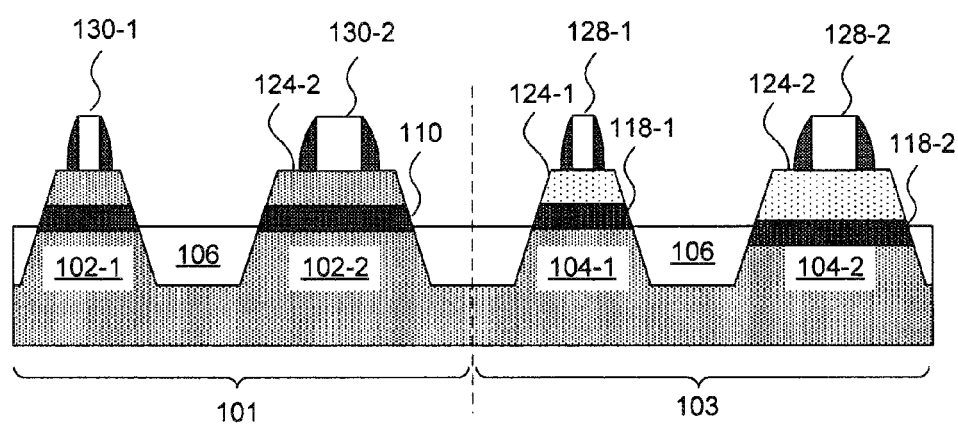

FIG. 1G is a diagram showing formation of gates 128, 130 on the features 102, 104. In one example, the gates 128, 130 run perpendicular to the underlying fin-like structures. The gates may also vary in size based on the size of the feature 102, 104 on which they are formed. For example, in the n-type region, the second gate 130-2 is wider than the first gate 130-1 as the second gate 130-2 is formed on a larger feature. Likewise, in the p-type region, the second gate 128-2 is wider than the first gate 128-1 as the second gate 128-2 is formed on a larger feature. The gates 128, 130 may also have sidewall spacers formed thereon. The sidewall spacers may be used for a variety of purposes, including defining where source/drain regions are to be formed.

FIG. 1G illustrates a semiconductor device after the processes described above. Specifically, the n-type features 102 in the n-type region have anti-punch-through features 110 that are at substantially similar depths. Additionally, the p-type features 104 in the p-type region 103 have anti-punch-through features 118 that are at varying depths. The depths of the anti-punch-through features 118 are based on the size of features 104 in which they are formed. Specifically, larger features 104 have deeper anti-punch-through features. Conversely, smaller features 104 have shallower anti-punch-through features. The channel size of transistors formed in the features 104 generally corresponds with the size of the feature. Specifically, larger features have larger channels. Thus, devices with larger channels will have deeper anti-punch-through features and devices with smaller channels will have shallower anti-punch-through features. This helps prevent current leakage and reduces the short channel effect for devices with smaller channels.

Figure 2:
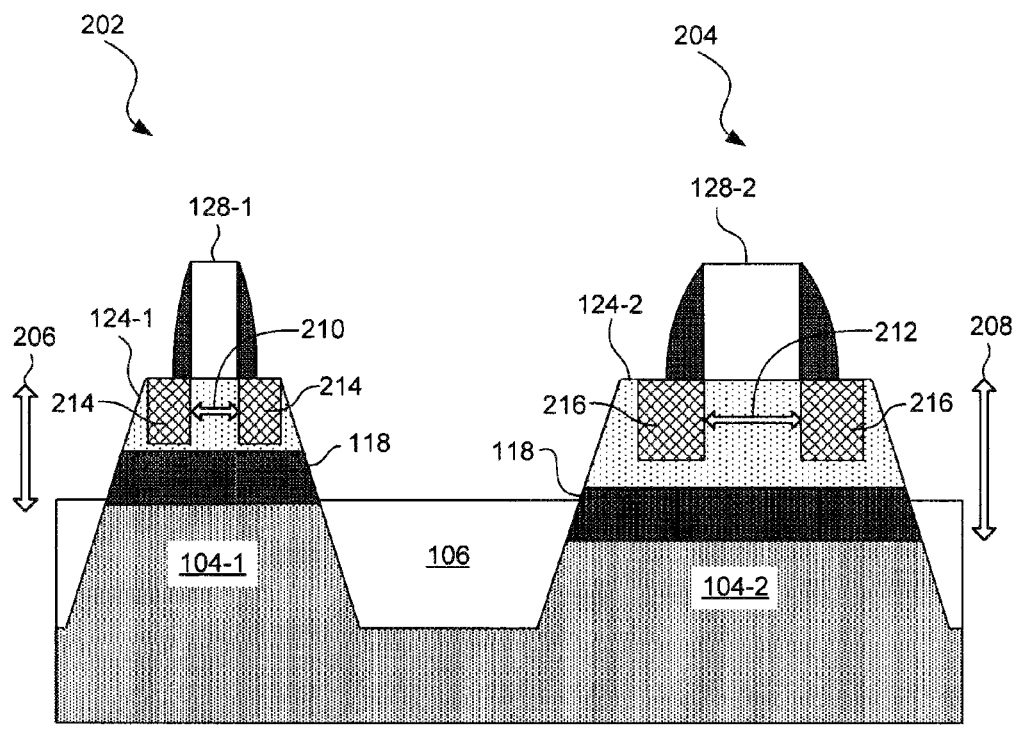
FIG. 2 is a diagram showing dimensions of devices with anti-punch-through features at varying depths, according to one example of principles described herein.

FIG. 2 is a diagram showing dimensions of p-type devices with anti-punch-through features at varying depths. According to the present example, the p-type region (e.g. 103, FIG. 1) includes a first transistor 202 and a second transistor 204. The first transistor 202 is formed on the first p-type feature 104-1, which is smaller than the second p-type feature 104-2. The first transistor 202 also includes source/drain regions 214, a gate 128-1, and a channel 210. The second transistor 204 also includes source/drain regions 216, a gate 128-2 and a channel 212.

The source/drain regions 214, 216 are formed adjacent to the respective gates 128. For p-type devices, the source/drain regions are doped with a p-type dopant. Thus, holes are used as the carrier for electric current. Depending on the signal applied to the gate 128, electric current will either be allowed to flow through the channel, or will be prevented from flowing through the channel. It is noted that the source/drain regions 214, 216 illustrated in FIG. 2 do not necessarily represent the actual shape of practically formed source/drain regions. Rather, the source/drain regions are shown for purposes of discussion.

The channel 210 of the first transistor 202 is smaller than the channel 212 of the second transistor 204. Accordingly, the anti-punch-through feature 118 of the first transistor 202 is shallower than the anti-punch-through feature of the second transistor 204. Specifically, there is a first distance 206 between the gate 128-1 and the bottom of the anti-punch-through feature of the first transistor 202. There is a second distance 208 between the gate 128-2 and the bottom of the anti-punch-through feature 118 of the second transistor 204. The first distance 206 is smaller than the second distance 208.

Because the first transistor 202 has a narrower channel 210, the first transistor 202 is more susceptible to short channel effects. As described above, the short channel effect can lead to undesirable performance as the voltage differential between the source and drain region may cause current to "punch through" the channel, even when the signal at the gate 128-1 is not intended to allow current to flow through the channel. The anti-punch-through feature 118, which has a higher n-type dopant concentration than that of both the underlying bulk silicon material and the semiconductor material 124 (e.g., silicon germanium) that forms the channel 210, 212, helps reduce the likelihood that current will punch through the channel when it is not intended for it to do so. Using principles described herein, transistors with shorter channels will have a shallower anti-punch-through feature, which will help suppress the short channel effects in such cases. Thus, devices using principles described herein can operate more efficiently.

Figure 3:
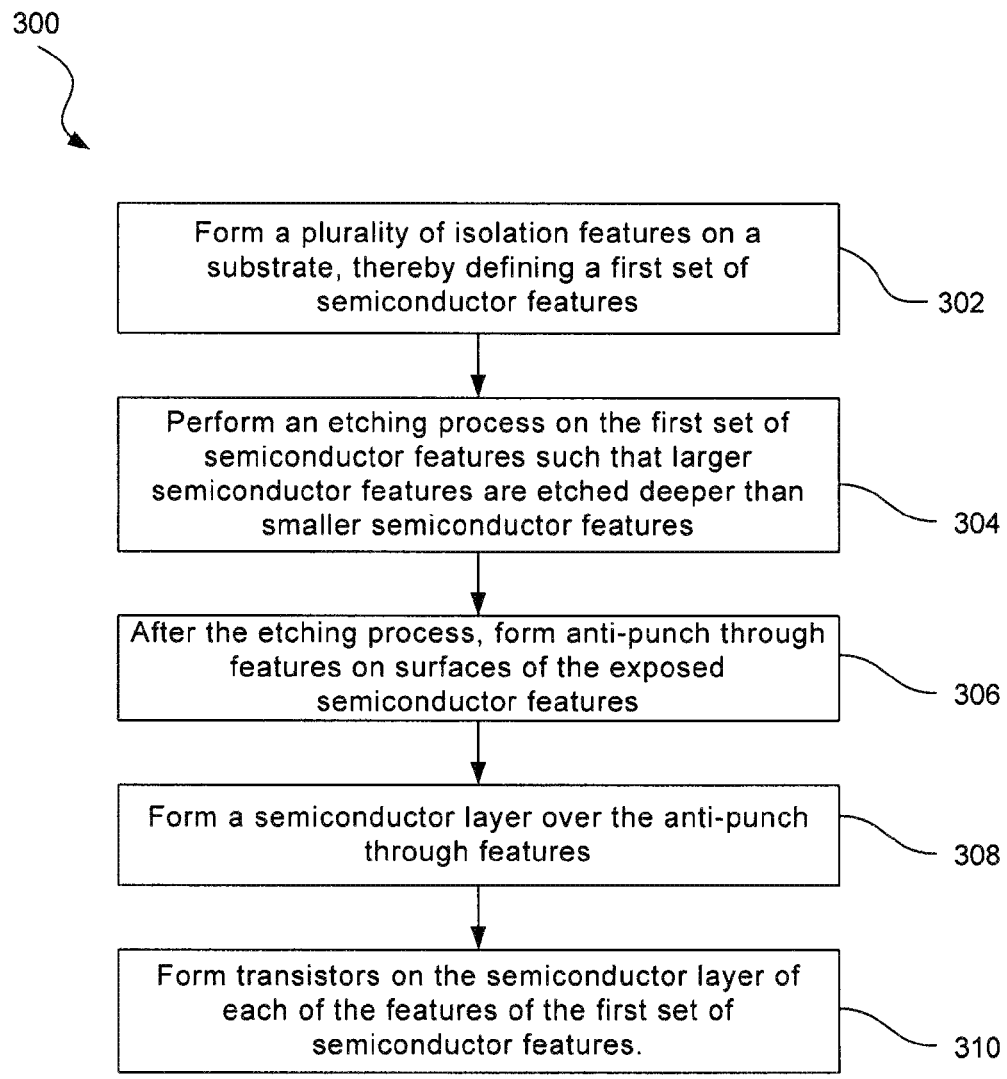
FIG. 3 is a flowchart showing an illustrative method for forming devices with anti-punch-through features at varying depths, according to one example of principles described herein.

FIG. 3 is a flowchart showing an illustrative method 300 for forming devices with anti-punch-through features at varying depths. The following method describes formation of features within the p-type region (e.g., 103, FIG. 1). According to the present example, the method 300 includes a step 302 for forming a plurality of isolation features on a substrate, thereby defining a number a first set of semiconductor features. This may be done by etching trenches where the isolation structures are to be formed. Then, the trenches can be filled with an isolation material, such as a dielectric material. A CMP process is then performed to planarize the surface of the substrate. Such isolation structures are often referred to as STI structures. The features around which the isolation structures are formed may be elongated fin-shaped structures. Such features are designed to become finFET structures after further processing.

According to the present example, the method 300 further includes a step 304 for performing an etching process on the semiconductor features such that larger semiconductor features are etched deeper than smaller semiconductor features. The etching process may be a dry etching process. Dry etching processes remove material by exposing the material to a bombardment of ions. This is done using plasma of reactive gases such as oxygen or chlorine with the addition of nitrogen or argon. The ions thus dislodge portions of the material from the exposed regions. Dry etching processes are generally anisotropic, which means that they etch primarily in one direction. Due to the loading effect, the larger features will be etched deeper than the smaller features.

According to the present example, the method 300 further includes a step 306 for forming anti-punch-through features on surface of the exposed semiconductor features. This is done after the etching process. Thus, due to the loading effect described above, the surfaces will have varying heights based on the size of the features. Forming the anti-punch-through features can be done through an ion implantation process. An ion implantation process involves use of an electrical field to accelerate ions to be impacted on a solid substrate. The accelerated ions will generally stay where they impact. The ion implantation process can be tuned, by tuning the electric field, so that the ions impact near the surface. The ion implantation process can be used to implant n-type dopants at a particular concentration that is appropriate for the anti-punch-through feature. Such a concentration is higher than the concentration of n-type dopants within the channel itself.

According to the present example, the method 300 further includes a step 308 for forming a semiconductor layer over the anti-punch-through features. The semiconductor layer is made of a semiconductor material that is suited for use as a channel material for a p-type transistor. In one example, the semiconductor layer is made of silicon germanium. The silicon germanium is also doped with n-type dopants with an appropriate concentration. The semiconductor layer may be formed using an epitaxial growth process. The semiconductor layer may be doped either in-situ or after formation of the semiconductor layer. In some examples, a CMP process may be performed to planarize the semiconductor layer so that the top surface of the semiconductor layer is co-planar with the top surface of the isolation structures.

According to the present example, the method 300 further includes a step 310 for forming transistors on the semiconductor layer of each of the semiconductor features of the first set of semiconductor features. The transistors may be finFET devices. Thus, the isolation structures may be etched so that the features protrude from the surface of the isolation structures to form fin-like features. Gates may then be formed over the fin-like features. Source and drain regions can then be formed adjacent the gates.

Using principles described herein, transistors with shorter channels will generally have shallower anti-punch-through features. The shallower anti-punch-through features will help suppress the short channel effects for the transistors with shorter channels. Thus, integrated circuits utilizing such features can operate more efficiently. Additionally, the above described process can be performed at a lower cost than conventional formation processes of anti-punch-through features.

Figure 4:
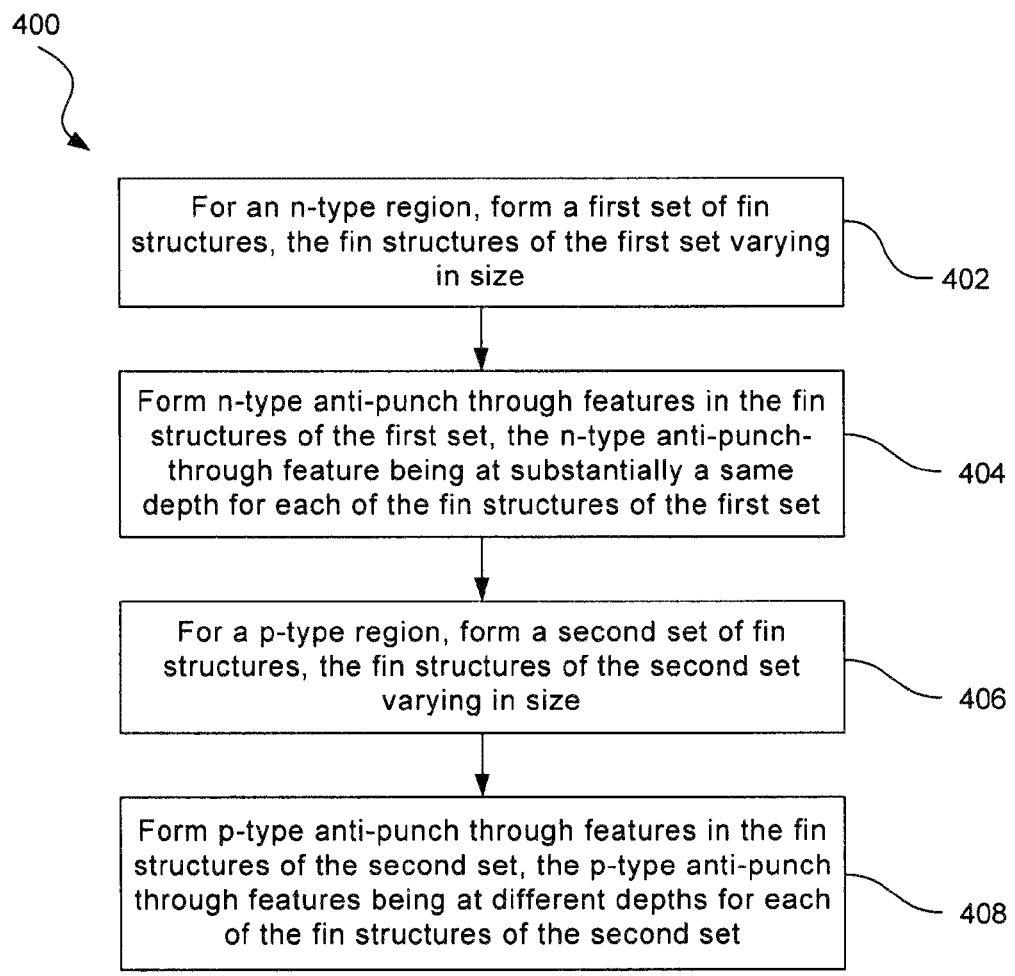
FIG. 4 is a flowchart showing an illustrative method 400 for forming n-type and p-type transistors on an integrated circuit, according to one example of principles described herein.

FIG. 4 is a flowchart showing an illustrative method 400 for forming n-type and p-type transistors on an integrated circuit. According to the present example, the method 400 includes a step 402 for, for an n-type region, forming a first set of fin structures, the fin structures of the first set varying in size. The fin structures may be formed according to the methods described above with respect to FIG. 1. Specifically, the fin structures may be formed such that they are surrounded by isolation structures, which may be STI structures.

According to the present example, the method 400 further includes a step 404 for forming n-type anti-punch-through features in the fin structures of the first set. The n-type anti-punch-through features are formed at substantially similar depths. Thus, even though the n-type features may vary in size, the anti-punch-through features are at substantially similar depths for each of the n-type features. The anti-punch-through features are also formed below the surface of the features such that there is room above the anti-punch-through features for a channel of a transistor.

The anti-punch though layers for the n-type features are formed using ion implantation. As described above, the ion implantation process is tuned such that the anti-punch-through features are formed below the surface. The anti-punch-through features of the n-type region comprise a p-type dopant. The anti-punch-through feature has a higher concentration of p-type dopants than the semiconductor material above the anti-punch-through features.

According to the present example, the method 400 includes a step 406 for, for a p-type region, forming a second set of fin structures, the fin structures of the second set varying in size. The fin structures may be formed according to the methods described above with respect to FIG. 1. Specifically, the fin structures may be formed such that they are surrounded by isolation structures, which may be STI structures.

According to the present example, the method 400 further includes a step 408 for forming p-type anti-punch-through features in the fin structures of the second set. The p-type anti-punch-through features are formed at varying depths. The varying depth is based on the respective size of the features in which the anti-punch-through features are formed. This can be done because the p-type features are etched before implanting the anti-punch-through features. Due to the loading effect, larger features are etched deeper. The ion implantation process that forms the anti-punch-through features is tuned so that the anti-punch-through features are formed at the surface, which varies based on feature size. Then, the channel material is epitaxially grown above the anti-punch-through features. The anti-punch-through features of the p-type region comprise an n-type dopant. The anti-punch-through features have a higher concentration of n-type dopants than the semiconductor material above the anti-punch-through features.

Figure 5A:
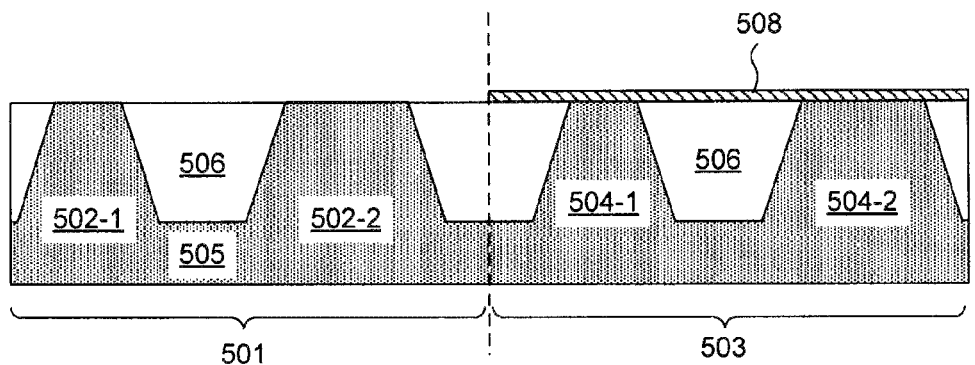
FIGS. 5A-5J are diagrams showing an illustrative process of formation for n-type and p-type devices with anti-punch-through features at varying depths, according to one example of principles described herein.

FIGS. 5A-5J are diagrams showing an illustrative process of formation for n-type and p-type devices with anti-punch-through features at varying depths. FIG. 5A illustrates the formation of several semiconductor features 502, 504 formed around isolation structures 506. Specifically, in an n-type region 501, a first set of semiconductor features 502-1, 502-2 is formed. The semiconductor features of the first set will ultimately be used for n-type transistors. In a p-type region 503, a second set of semiconductor features 504-1, 504-2 is formed. The semiconductor features 504-1, 504-2 of the second set will ultimately be used for p-type transistors.

In one example, the semiconductor features 502-1, 502-2, 504-1, 504-2 are formed by creating isolation structures 106 around the features. An isolation structure 506 may be, for example, a Shallow Trench Isolation (STI) structure. Such structures are created by etching trenches within a semiconductor substrate 505. Then, the trenches can be filled with an isolation material, such as a dielectric material. Then, a planarizing process such as a Chemical Mechanical Polishing (CMP) process is performed to create a flat surface and remove any excess material.

The semiconductor features 502-1, 502-2 within the n-type region 501 may be referred to as n-type features because the semiconductor material therein is doped appropriately to form an n-type transistor. Specifically, the semiconductor material is doped with a p-type dopant such as boron. Similarly, the semiconductor features 504-1, 504-2 within the p-type region 503 may be referred to as p-type features because they will ultimately be doped appropriately to form a p-type transistor. Specifically, they will be doped with an n-type dopant such as phosphorous.

In various semiconductor devices, different transistors may have different sizes. According to the present example, a first n-type feature 502-1 within the n-type region 501 is smaller than a second n-type feature 502-2 in the n-type region 501. Likewise, a first p-type feature 504-1 within the p-type region 503 is smaller than a second p-type feature 504-2 in the p-type region 503.

Figure 5B:
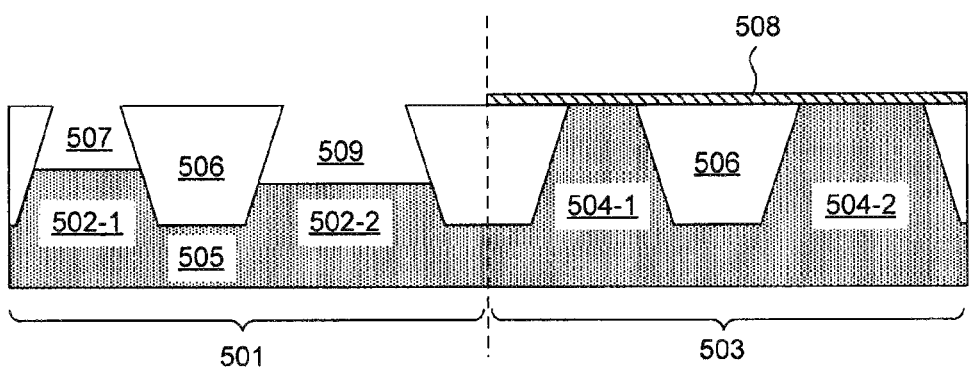

FIG. 5B is a diagram showing an illustrative etching process 510 performed on the n-type region 501. Before the etching process 510 is performed, a mask layer 508 is applied to the p-type region 503 to protect the p-type region 503 from the etching process 510 and other processes that will be described below. The mask layer 508 may be made of an oxide material or other suitable material such as silicon nitride, silicon oxynitride, a combination thereof, or any other suitable dielectric material. The mask 508 may be patterned using various photolithographic techniques.

The etching process 510 is designed to remove exposed semiconductor material while leaving the isolation structures 506 substantially intact. The etching process may be, for example, a dry etching process. The etching process produces trenches 507, 509. Due to the loading effect, the semiconductor features that are larger will be etched more quickly than the smaller semiconductor features. Thus, because semiconductor feature 502-1 is smaller than semiconductor feature 502-2, semiconductor feature 502-2 is etched further than semiconductor feature 502-1.

Figure 5C:
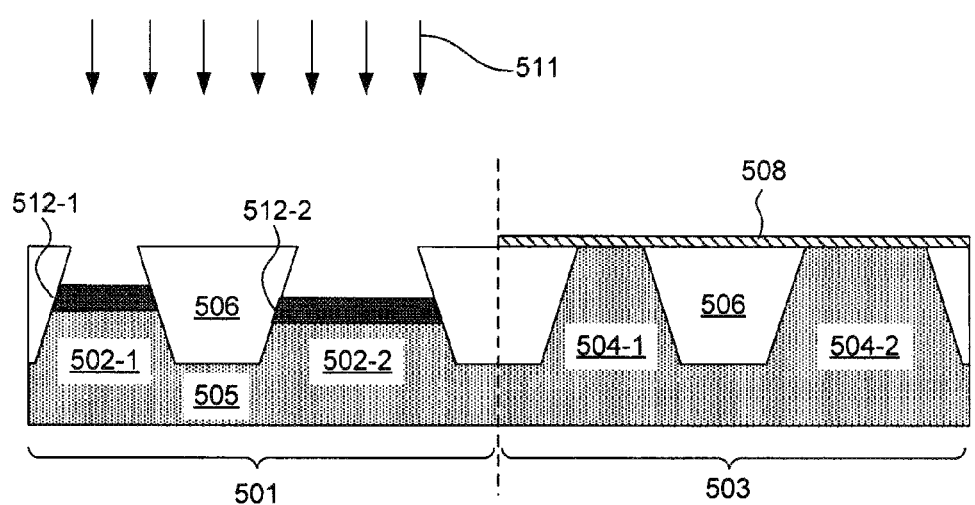

FIG. 5C is a diagram showing an illustrative epitaxial formation process 511 to form epitaxial anti-punch-through features 512-1, 512-2 in the n-type region 501. Because the anti-punch-through features 512-1, 512-2 are formed through an epitaxial process, they will be referred to as epitaxial anti-punch-through features 512-1, 512-2. An epitaxial process involves the growth of a crystal structure on a crystal substrate. In this case, the epitaxial anti-punch-through features 512-1, 512-2 are made of a semiconductor material such as silicon and are formed on the semiconductor features 502-1, 502-2. In some examples, the epitaxial anti-punch-through features 512-1, 512-2 may include a different type of semiconductor material than the semiconductor features 502-1, 502-2. For example, the semiconductor features 502-1, 502-2 may be made of silicon and the epitaxial anti-punch-through features 512-1, 512-2 may include a 111-V semiconductor material. The epitaxial anti-punch-through features 512-1, 512-2 may be formed to have a thickness within a range of about 5-10 nanometers extending from the surface of the features 502-1, 502-2. In one example, the concentration of the n-type dopant for the epitaxial anti-punch-through features 512-1, 512-2 is within a range of about $1 \times 10^{17}/cm^3$-$1 \times 10^{18}/cm^3$.

Figure 5D:
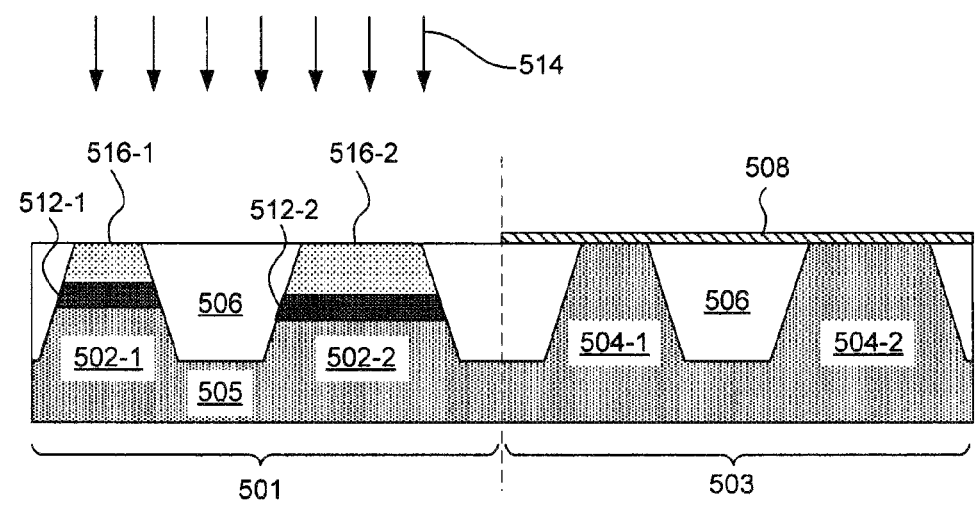

FIG. 5D is a diagram showing an illustrative formation process 514 to form epitaxial semiconductor layers 516-1, 516-2 on top of the anti-punch-through features 502-1, 502-2. The epitaxial semiconductor layers 516-1, 516-2 may include semiconductor material that is designed for use as a channel material for an n-type device. Thus, the epitaxial semiconductor layers 516-1, 516-2 are doped with a p-type dopant. The epitaxial semiconductor layers 516-1, 516-2 may also be doped in-situ. In one example, the epitaxial semiconductor layers 516-1, 516-2 may include silicon, or a III-V semiconductor material. In one example, the epitaxial semiconductor layers 516-1, 516-2 are made of different material than the epitaxial anti-punch-through features 512-1, 512-2. Thus, epitaxial semiconductor layers 516-1, 516-2 may have a different lattice constant then the epitaxial anti-punch-through features 512-1, 512-2. The different lattice constant between the epitaxial semiconductor layers 516-1, 516-2 and the epitaxial anti-punch-through features 512-1, 512-2 may cause straining in either the epitaxial semiconductor layers 516-1, 516-2 or the epitaxial anti-punch-through features 512-1, 512-2. The epitaxial semiconductor layers 516-1, 516-2 may be doped with the same type of dopant as the underlying epitaxial anti-punch-through features 512-1, 512-2. But, the doping concentration of the epitaxial semiconductor layers 516-1, 516-2 may be less than the doping concentration of the epitaxial anti-punch-through features 512-2. Additionally, because the first feature 502-1 has a smaller width than the second feature 502-2, the epitaxial semiconductor layer 516-1 formed on the first feature 502-1 also has a smaller width than the semiconductor layer 516-2 formed on the second feature 502-2. After the epitaxial semiconductor layers 516-1, 516-2 are formed, the mask layer 508 covering the p-type region 503 may be removed. Additionally, a CMP process may be performed to planarize the surface of the wafer.

Figure 5E:
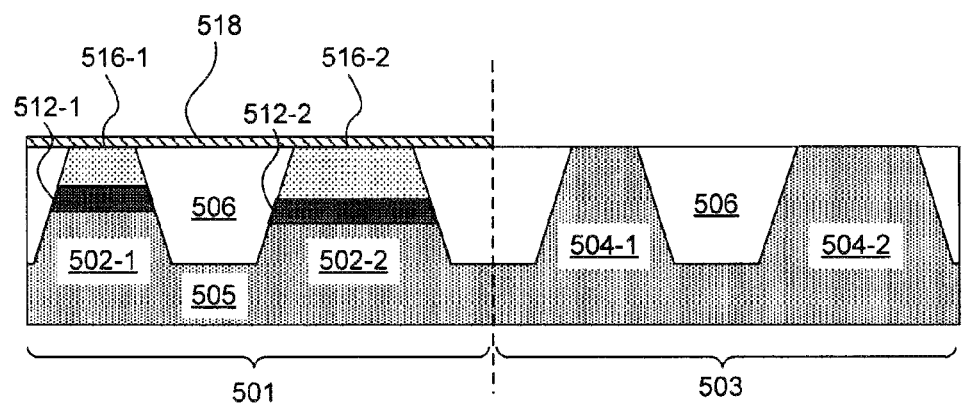

FIG. 5E is a diagram showing an illustrative process for forming a mask 518 over the n-type region 501. The mask layer 518 is patterned such that it covers the n-type region 101 and exposes the p-type region 103. The mask layer 518 may also be made of an oxide material or other material as described above regarding mask 108, and may be patterned using various photolithographic techniques.

Figure 5F:
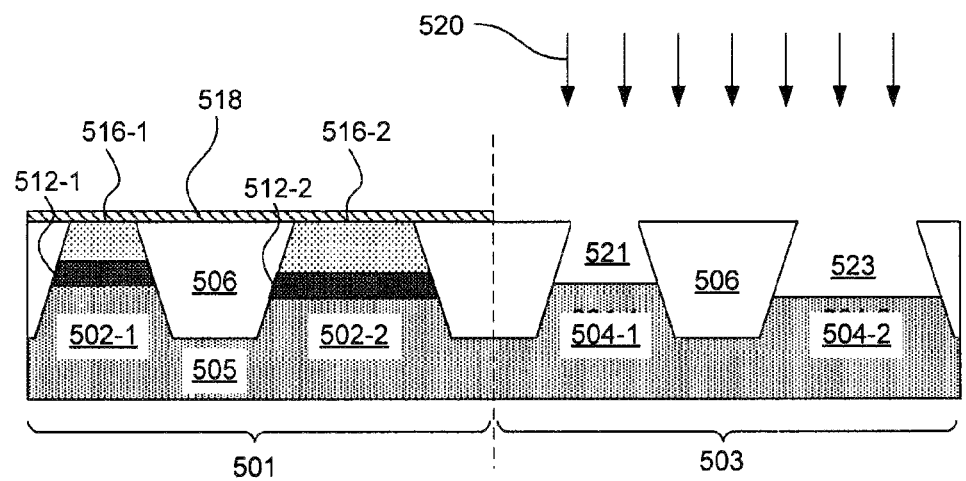

FIG. 5F is a diagram showing an illustrative removal process 520 that is performed to remove exposed semiconductor material while leaving the isolation structures 106 substantially intact. The etching process may be, for example, a dry etching process. The etching process 520 produces trenches 521, 523. Due to the loading effect, the features that are larger will be etched more quickly than the smaller features. Specifically, because the second feature 504-2 is larger than the first feature 504-1, the second feature 504-2 will be etched deeper than the first feature 504-1.

Figure 5G:
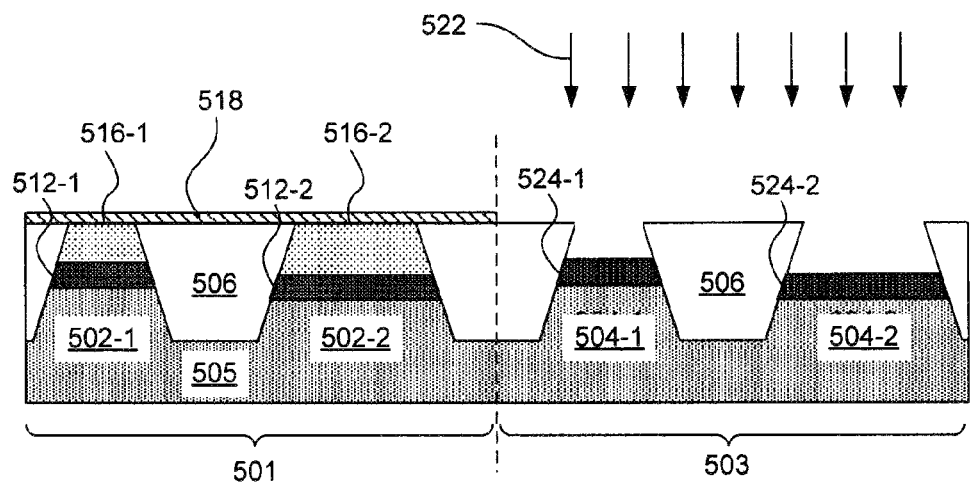

FIG. 5G is a diagram showing an illustrative formation process 522 to form epitaxial anti-punch-through features 524-1, 524-2 for the p-type region 503. In the present example, the formation process 522 is an epitaxial growth process. In this case, the epitaxial anti-punch-through features 524-1, 524-2 are made of a semiconductor material such as silicon germanium and are formed on the semiconductor features 504-1, 504-2. In some examples, the epitaxial anti-punch-through features 524-1, 524-2 may include a different type of semiconductor material than the features 504-1, 504-2. For example, the features 502-1, 502-2 may be made of silicon and the epitaxial anti-punch-through features 512-1, 512-2 may include silicon germanium. The epitaxial anti-punch-through features 524-1, 524-2 may be formed to have a thickness within a range of about 5-10 nanometers extending from the surface of the features 504-1, 504-2. In one example, the concentration of the n-type dopant for the epitaxial anti-punch-through features 524-1, 524-2 is within a range of about $1 \times 10^{17}/cm^3$-$1 \times 10^{18}/cm^3$.

Figure 5H:
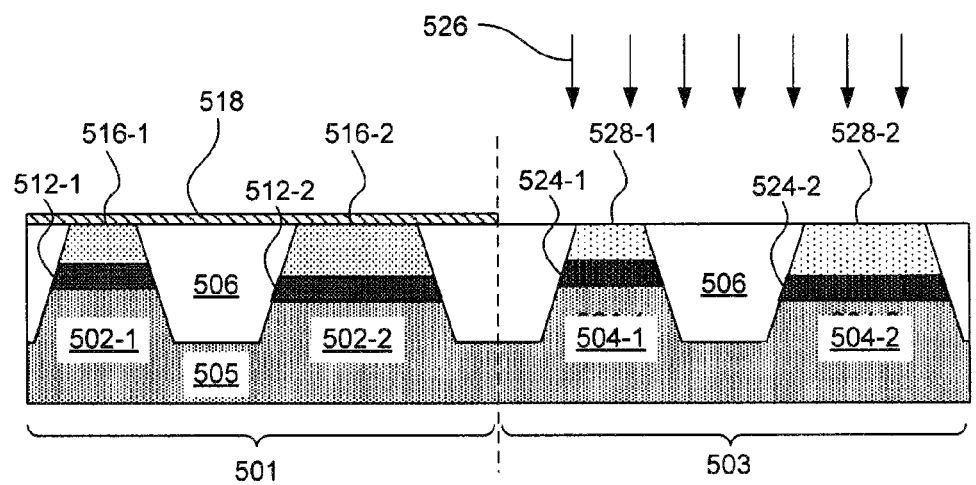

FIG. 5H is a diagram showing an illustrative formation process 526 to form epitaxial semiconductor layers 516-1, 516-2 on top of the anti-punch-through features 502-1, 502-2. The epitaxial semiconductor layers 528-1, 528-2 may include semiconductor material that is designed for use as a channel material for a p-type device. Thus, the epitaxial semiconductor layers 528-1, 528-2 are doped with an n-type dopant. The epitaxial semiconductor layers 528-1, 528-2 may also be doped in-situ. In one example, the epitaxial semiconductor layers 528-1, 528-2 may include silicon germanium or pure germanium. In one example, the epitaxial semiconductor layers 528-1, 528-2 are made of different material than the epitaxial anti-punch-through features 524-1, 524-2. Thus, epitaxial semiconductor layers 528-1, 528-2 may have a different lattice constant then the epitaxial anti-punch-through features 524-1, 524-2. The different lattice constant between the epitaxial semiconductor layers 528-1, 528-2 and the epitaxial anti-punch-through features 524-1, 524-2 may cause straining in either the epitaxial semiconductor layers 528-1, 528-2 or the epitaxial anti-punch-through features 524-1, 524-2. The epitaxial semiconductor layers 528-1, 528-2 may be doped with the same type of dopant as the underlying epitaxial anti-punch-through features 524-1, 524-2. But, the doping concentration of the epitaxial semiconductor layers 528-1, 528-2 may be less than the doping concentration of the epitaxial anti-punch-through features 524-1, 524-2. Additionally, because the first feature 504-1 has a smaller width than the second feature 504-2, the epitaxial semiconductor layer 528-1 formed on the first feature 504-1 also has a smaller width than the semiconductor layer 528-2 formed on the second feature 504-2.

Figure 5I:
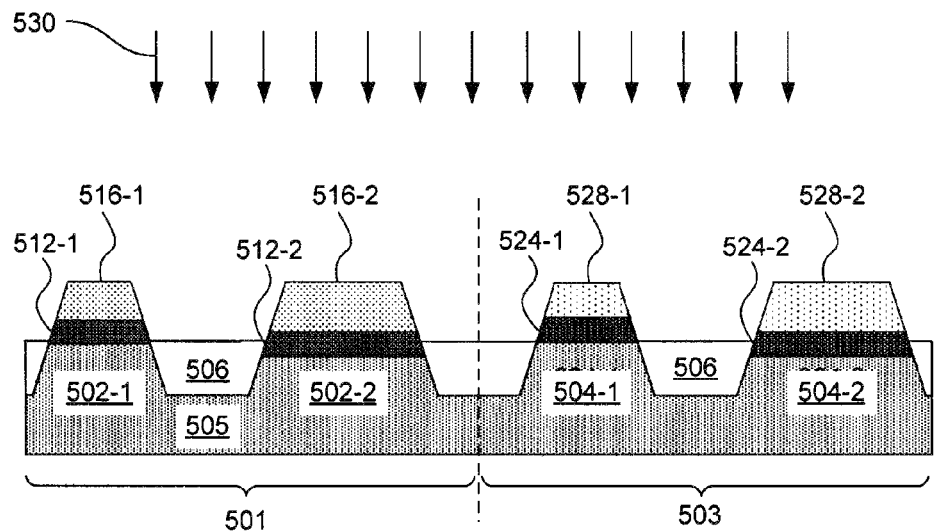

FIG. 5I is a diagram showing an illustrative finFET (fin Field Effect Transistor) formation process. This is done by performing a removal process 530 to remove portions of the isolation structures 106. In one example, the removal process 530 is an etching process. The etching process 126 is selective such that the material forming the isolation structures is removed while the remaining features 502-1, 502-2, 504-1, 504-2 are left substantially intact. The result is that the features 502-1, 502-2, 504-1, 504-2 now protrude from the surface of the isolation structures to form fin-like shapes. Such fin-like shapes can provide a number of benefits to transistors.

Figure 5J:
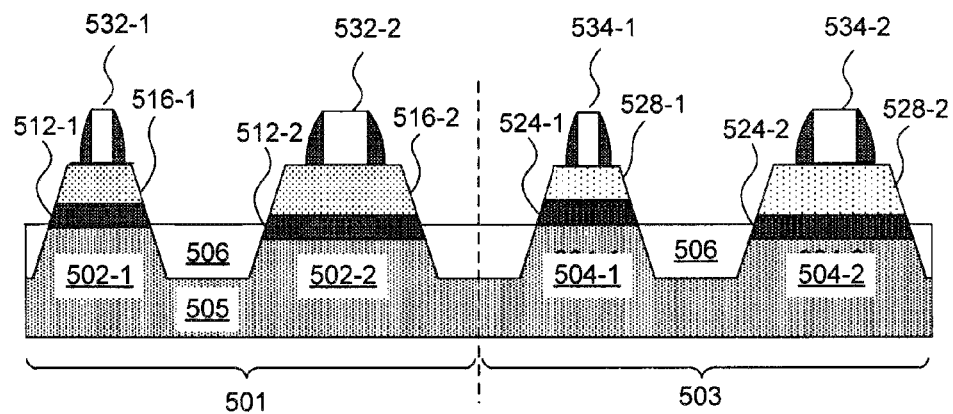

FIG. 5J is a diagram showing formation of gates 532-1, 532-2, 534-1, 534-2 on the features 502-1, 502-2, 504-1, 504-2. In one example, the gates 532-1, 532-2, 534-1, 534-2 run perpendicular to the underlying fin-like structures. The gates 532-1, 532-2, 534-1, 534-2 may also vary in size based on the size of the feature 502-1, 502-2, 504-1, 504-2 on which they are formed. For example, in the n-type region, the second gate 532-2 is wider than the first gate 532-1 as the second gate 532-2 is formed on a larger feature. Likewise, in the p-type region, the second gate 534-2 is wider than the first gate 534-1 as the second gate 534-2 is formed on a larger feature. The gates 532-1, 532-2, 534-1, 534-2 may also have sidewall spacers formed thereon. The sidewall spacers may be used for a variety of purposes, including defining where source/drain regions are to be formed.

FIG. 5J illustrates a semiconductor device after the processes described above. Specifically, the n-type features 502-1, 502-2 in the n-type region 501 have epitaxial anti-punch-through features 512-1, 512-2 that are at varying depths. Likewise, the p-type features 504-1, 504-2 in the p-type region 503 have anti-punch-through features 524-1, 524-2 that are at varying depths. The depths of the anti-punch-through features 512-1, 512-2, 524-2, 524-2 are based on the size of features 502-1, 502-2, 504-1, 504-2 on which they are formed. Specifically, larger features have deeper anti-punch-through features. Conversely, smaller features have shallower anti-punch-through features. The channel size of transistors formed in the features generally corresponds with the size of the feature. Specifically, larger features have larger channels. Thus, devices with larger channels will have deeper anti-punch-through features and devices with smaller channels will have shallower anti-punch-through features. This helps prevent current leakage and reduces the short channel effect for devices with smaller channels.

Figure 6A:
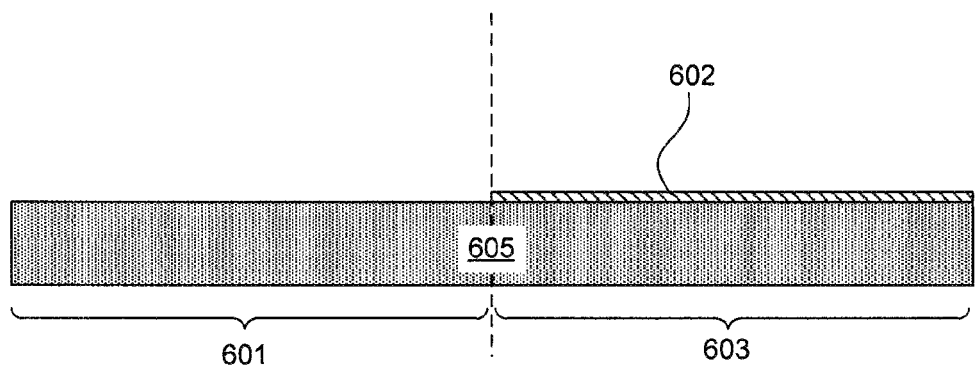
FIGS. 6A-6I are diagrams showing an illustrative process of formation for anti-punch-through features by blanket epitaxial growth before the patterning of fin structures, according to one example of principles described herein.

FIGS. 6A-6I are diagrams showing an illustrative process of formation for anti-punch-through features by blanket epitaxial growth before the patterning of fin structures, according to one example of principles described herein. According to the present example, FIG. 6A illustrates a semiconductor substrate 605 that includes a p-type region 603 and an n-type region 601. Before forming features in the n-type region 601 a mask 602 is deposited. The mask 602 is patterned so that it exposes the n-type region 601 while protecting the p-type region 603.

Figure 6B:
Figure 6B:
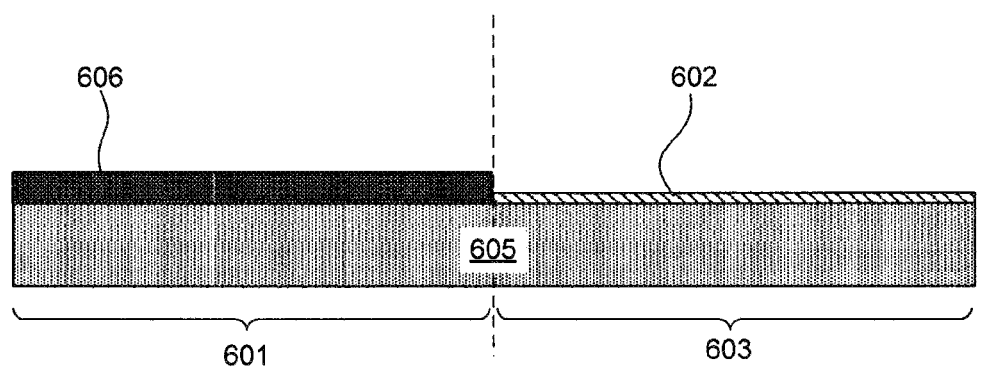

FIG. 6B is a diagram showing an illustrative formation process 604 used to form a blanket epitaxial anti-punch-through layer 606. Thus, the formation process 604 is an epitaxial process. In the present example, the epitaxial process 604 is applied to the entire surface of the semiconductor substrate 605 that is exposed through the mask 602. In some examples, the epitaxial process 604 may include in-situ doping with the p-type dopant. In this case, the epitaxial anti-punch-through layer 606 is made of a semiconductor material such as silicon. In some examples, the epitaxial anti-punch-through layer 606 may include a different type of semiconductor material than the semiconductor substrate 605. For example, the semiconductor substrate 605 may be made of silicon and the epitaxial anti-punch-through layer 606 may include a III-V semiconductor material. The epitaxial anti-punch-through layer 606 may be formed to have a thickness within a range of about 5-10 nanometers extending from the surface of the substrate 605. In one example, the concentration of the p-type dopant for the epitaxial anti-punch-through layer 606 is within a range of about $1\times10^{17}/cm^3$-$1\times10^{18}/cm^3$.

Figure 6C:
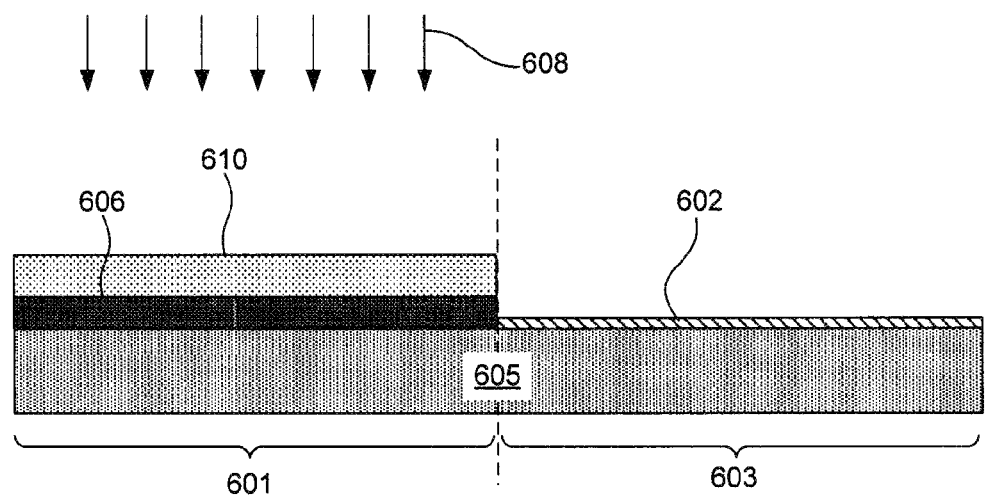

FIG. 6C is a diagram showing an illustrative formation process 608 to form an epitaxial semiconductor layer 610 on top of the anti-punch-through layer 606. The epitaxial semiconductor layer 610 may include semiconductor material that is designed for use as a channel material for an n-type device. Thus, the epitaxial semiconductor layer 610 may be doped with a p-type dopant. The epitaxial semiconductor layer 610 may also be doped in-situ. In one example, the epitaxial semiconductor layer 610 includes silicon, or a III-V semiconductor material. In one example, the epitaxial semiconductor layer 610 is made of different material than the epitaxial anti-punch-through layer 606. Thus, epitaxial semiconductor layer 610 may have a different lattice constant then the epitaxial anti-punch-through layer 606. The different lattice constant between the epitaxial semiconductor layer 610 and the epitaxial anti-punch-through layer 606 may cause straining in either the epitaxial semiconductor layer 610 or the epitaxial anti-punch-through layer 606. The epitaxial semiconductor layer 610 may be doped with the same type of dopant as the underlying epitaxial anti-punch-through layer 606. But, the doping concentration of the epitaxial semiconductor layer 610 may be less than the doping concentration of the epitaxial anti-punch-through layer 606.

Figure 6D:
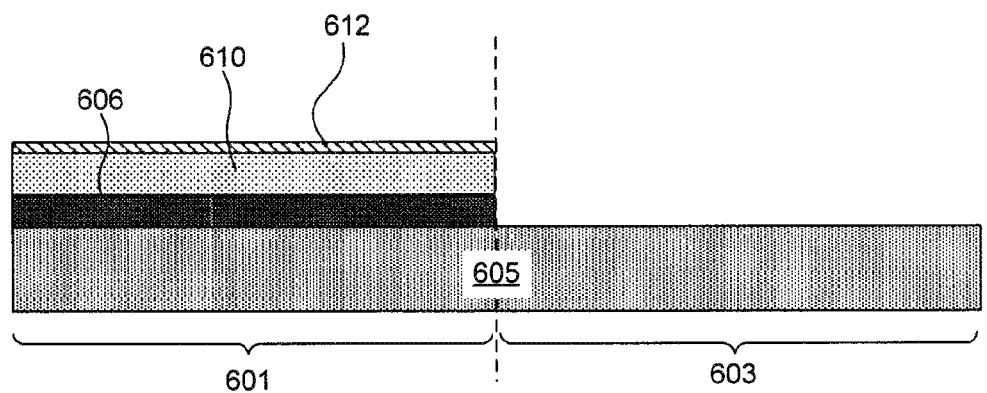

FIG. 6D is a diagram showing deposition of a mask 612 over the n-type region 601. The mask 612 may be a dielectric material such as an oxide material or a nitride material. The mask 612 covers the n-type region and exposes the p-type region. The mask 612 may be formed by depositing the mask material over the entire substrate 605 and then patterning the mask using various photolithographic techniques to expose the p-type region. Additionally, the mask 602 covering the p-type region 603 is removed to expose the p-type region 603.

Figure 6E:
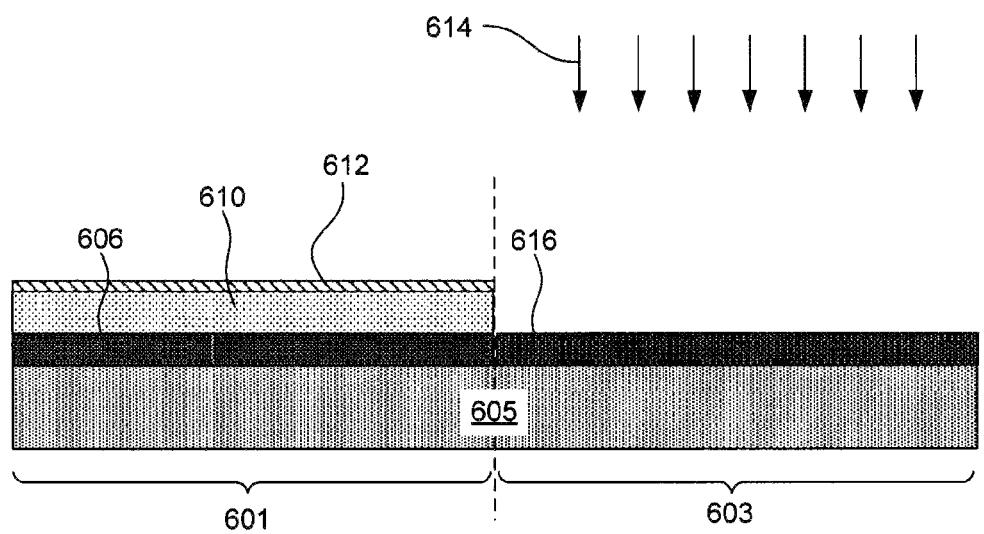

FIG. 6E is a diagram showing an illustrative formation process 614 to form an epitaxial anti-punch-through layer 616 for the p-type region 503. In the present example, the formation process 614 is an epitaxial growth process. In this case, the epitaxial anti-punch-through layer 616 made of a semiconductor material such as silicon germanium and is formed on the semiconductor substrate 605. In some examples, the epitaxial anti-punch-through layer 616 may include a different type of semiconductor material than the semiconductor substrate 605. For example, the semiconductor substrate 605 may be made of silicon and the epitaxial anti-punch-through layer 616 may include silicon germanium. The epitaxial anti-punch-through layer 616 may be formed to have a thickness within a range of about 5-10 nanometers extending from the surface of the semiconductor substrate 605. In one example, the concentration of the n-type dopant for the epitaxial anti-punch-through layer 616 is within a range of about $1 \times 10^{17}/cm^3$-$1 \times 10^{18}/cm^3$.

Figure 6F:
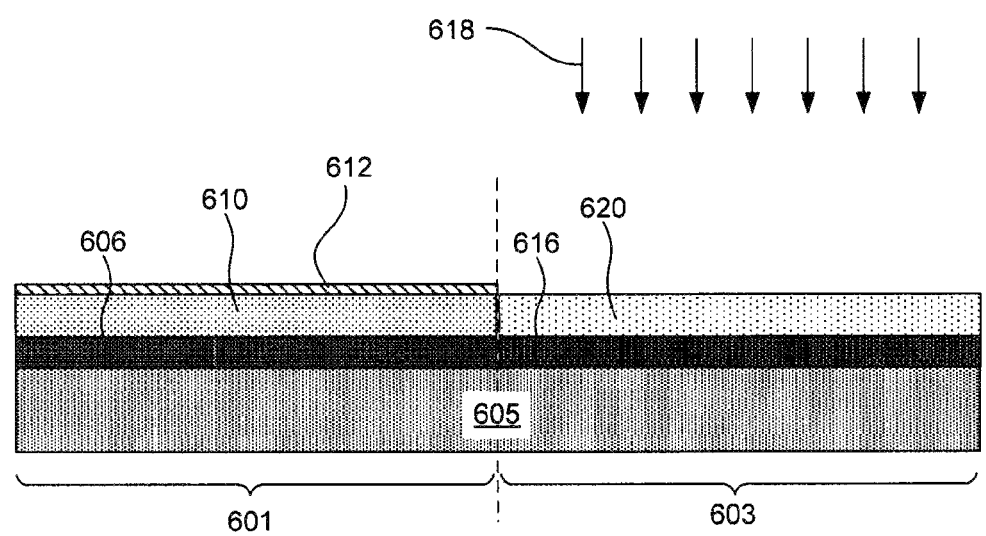

FIG. 6F is a diagram showing an illustrative formation process 618 to form an epitaxial semiconductor layer 620 on top of the anti-punch-through layer 616. The epitaxial semiconductor layer 620 may include semiconductor material that is designed for use as a channel material for a p-type device. Thus, the epitaxial semiconductor layer 620 is doped with an n-type dopant. The epitaxial semiconductor layer 620 may be doped in-situ. In one example, the epitaxial semiconductor layer 620 may include silicon germanium or pure germanium. In one example, the epitaxial semiconductor layer 620 is made of different material than the epitaxial anti-punch-through layer 616. Thus, epitaxial semiconductor layer 620 may have a different lattice constant than the epitaxial anti-punch-through layer 616. The different lattice constant between the epitaxial semiconductor layer 620 and the epitaxial anti-punch-through layer 616 may cause straining in either the epitaxial semiconductor layer 620 or the epitaxial anti-punch-through layer 616. The epitaxial semiconductor layer 620 may be doped with the same type of dopant as the underlying epitaxial anti-punch-through layer 616. But, the doping concentration of the epitaxial semiconductor layer 620 may be less than the doping concentration of the epitaxial anti-punch-through layer 616.

Figure 6G:
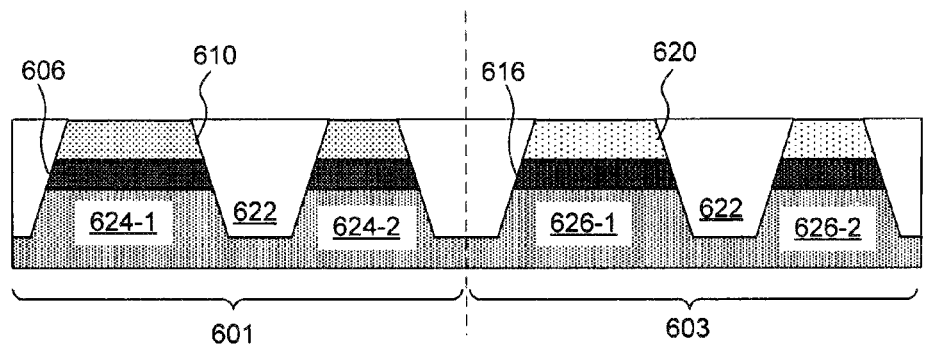

FIG. 6G illustrates the formation of several features 624-1, 624-2, 626-1, 626-2 formed around isolation structures 622. In one example, to form the features 624-1, 624-2, 626-1, 626-2, the isolation structures 622 are formed into the substrate. In one example, the isolation structures 622 are formed by using various photolithographic techniques to form trenches within the substrate. Those trenches could then be filled with a dielectric material. A CMP process can then be used to planarize the surface of the substrate to expose the features 624-1, 624-2, 626-1, 626-2. The semiconductor features 624-1, 624-2 within the n-type region 601 may be referred to as n-type features because the semiconductor material therein is doped appropriately to form an n-type transistor. Specifically, the semiconductor material is doped with a p-type dopant such as boron. Similarly, the semiconductor features 626-1, 626-2 within the p-type region 603 may be referred to as p-type features because they will ultimately be doped appropriately to form a p-type transistor. Specifically, they will be doped with an n-type dopant such as phosphorous.

Figure 6H:
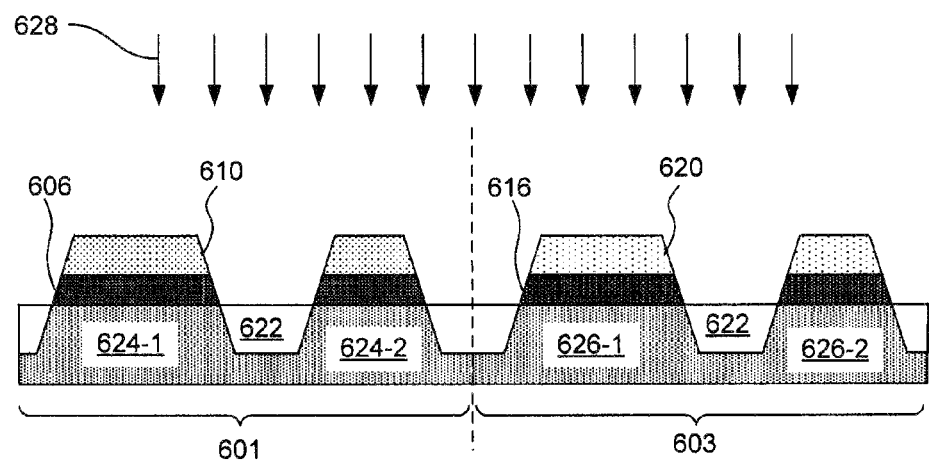

FIG. 6H is a diagram showing illustrative removal process 628. In one example, the removal process 624 is an etching process used to remove the upper portions of the isolation structures 622. The removal process 628 is selective such that the material forming the isolation structures 622 is removed while the remaining features 624-1, 624-2, 626-1, 626-2 are left substantially intact. The result is that the features 624-1, 624-2, 626-1, 626-2 now protrude from the surface of the isolation structures 622 to form fin-like shapes. Such fin-like shapes can provide a number of benefits to transistors.

Figure 6I:
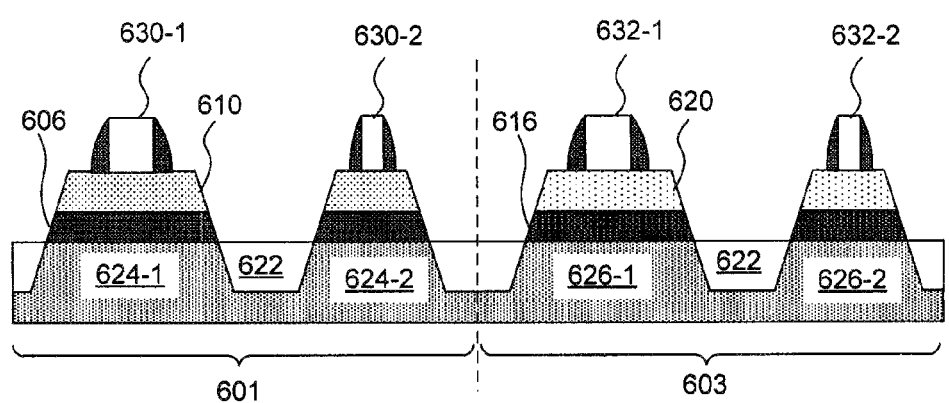

FIG. 6I is a diagram showing formation of gates 630-1, 630-2, 632-1, 632-2 on the features 624-1, 624-2, 626-1, 626-2. In one example, the gates 630-1, 630-2, 632-1, 632-2 run perpendicular to the underlying fin-like structures. The gates 630-1, 630-2, 632-1, 632-2 may also vary in size based on the size of the feature 502-1, 502-2, 504-1, 504-2 on which they are formed. For example, in the n-type region, the first gate 630-1 is wider than the second gate 630-2 as the first gate 630-1 is formed on a larger feature. Likewise, in the p-type region, the first gate 632-1 is wider than the second gate 632-2 as the first gate 632-1 is formed on a larger feature. The gates 630-1, 630-2, 632-1, 632-2 may also have sidewall spacers formed thereon. The sidewall spacers may be used for a variety of purposes, including defining where source/drain regions are to be formed.

Using techniques described herein, the anti-punch-through layers 606, 616 will be coplanar with each other. Additionally, because the anti-punch-through layers 606, 616 and semiconductor layers 610, 620 are formed using an epitaxial process, they will exhibit certain characteristics. For example, the anti-punch-through layers 606, 616 and the semiconductor layers 610, 620 may be made of different materials and thus have different lattice constants. Thus, the anti-punch through layers 606, 616 and the semiconductor layer 610, 620 may be strained.

Figure 7:
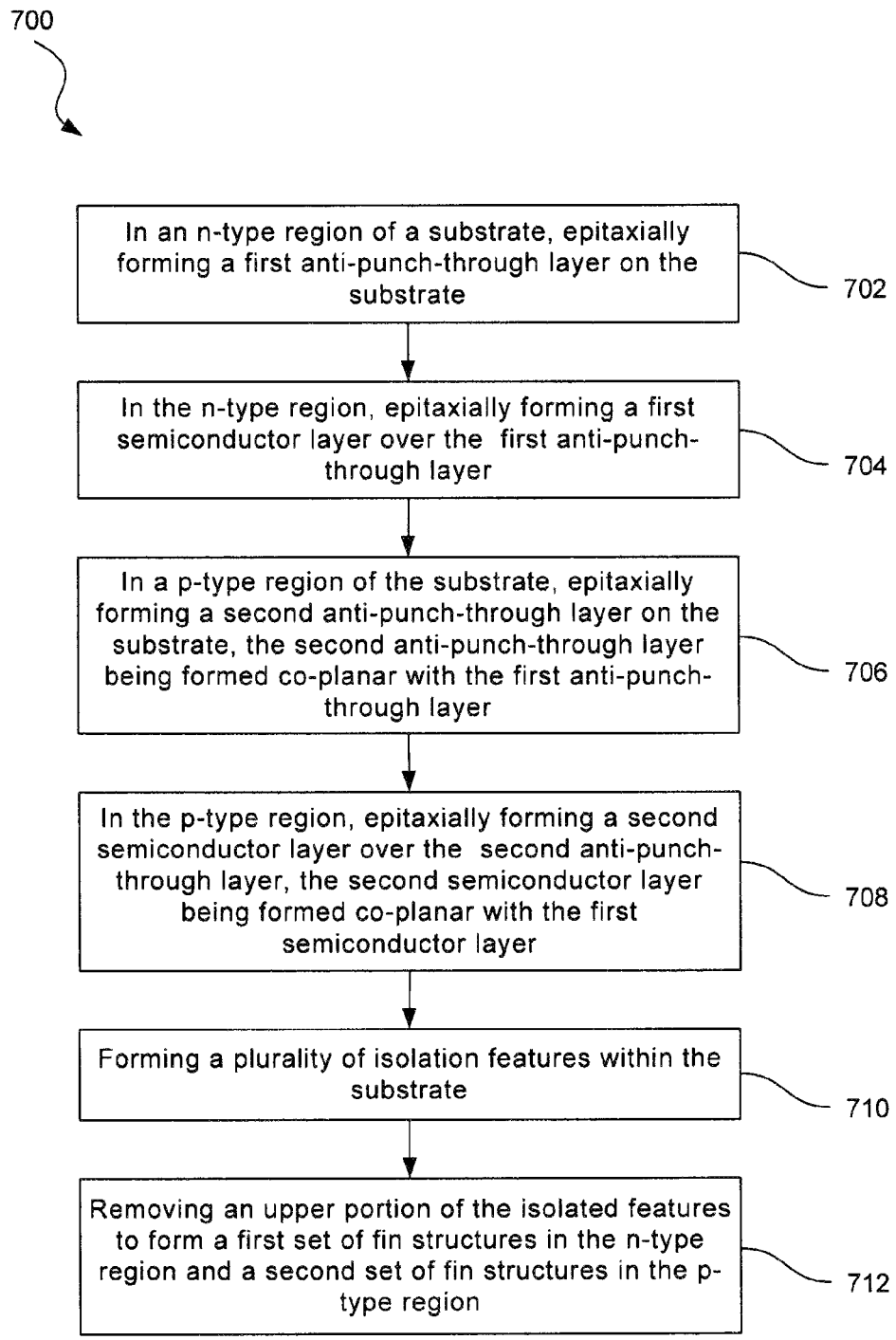
FIG. 7 is a flowchart showing an illustrative method for forming anti-punch-through features by blanket epitaxial growth before the patterning of fin structures, according to one example of principles described herein.

FIG. 7 is a flowchart showing an illustrative method for forming anti-punch-through features by blanket epitaxial growth before the patterning of fin structures. According to the present example, the method 700 includes a step 702 for, in an n-type region of a substrate, epitaxially forming a first anti-punch-through layer on the substrate. The first anti-punch-through layer may be formed as a blanket epitaxial layer across the entire exposed n-type region. In some examples, the first anti-punch-through layer is doped in-situ. In one example, step 702 corresponds to the method described above in accordance with FIG. 6B.

According to the present example, the method 700 further includes a step 704 for, in the n-type region, epitaxially forming a first semiconductor layer over the first anti-punch-through layer. The first semiconductor layer may be formed as a blanket epitaxial layer over the entire exposed n-type region. The first semiconductor layer may also be doped in-situ with the same type of dopant as the first anti-punch-through layer, but at a lower doping concentration. In some examples, step 704 corresponds to the method described above in accordance with FIG. 6C.

According to the present example, the method 700 further includes a step 706 for, in a p-type region of the substrate, epitaxially forming a second anti-punch-through layer on the substrate, the second anti-punch-through layer being formed co-planar with the first anti-punch-through layer. The second anti-punch-through layer may be formed as a blanket epitaxial layer across the entire exposed n-type region. In some examples, the anti-punch-through layer may be doped in-situ. In some examples, step 706 corresponds to the method described above in court FIG. 6E.

According to the present example, the method 700 further includes a step 708 for, in the p-type region, epitaxially forming a second semiconductor layer over the second anti-punch-through layer, the second semiconductor layer being formed co-planar with the first semiconductor layer. The second semiconductor layer may also be doped in-situ with the same type of dopant as the second anti-punch-through layer, but at a lower doping concentration. In some examples, step 708 corresponds to the method described above in accordance with FIG. 6F.

According to the present example, the method 700 further includes a step 710 for forming a plurality of isolation features within the substrate. In one example, the isolation features are patterned so as to form various sized fin structures within the substrate. In one example, step 710 corresponds to the method described above in accordance with FIG. 6G.

According to the present example, the method 700 further includes a step 712 for removing an upper portion of the isolated features to form a first set of fin structures in the n-type region and a second set of fin structures in the p-type region. In one example, this is done with an etching process. Step 712 may correspond to the method described above in accordance with FIG. 6H. Then, transistors can be formed on top of the fin structures.

Figure 8:
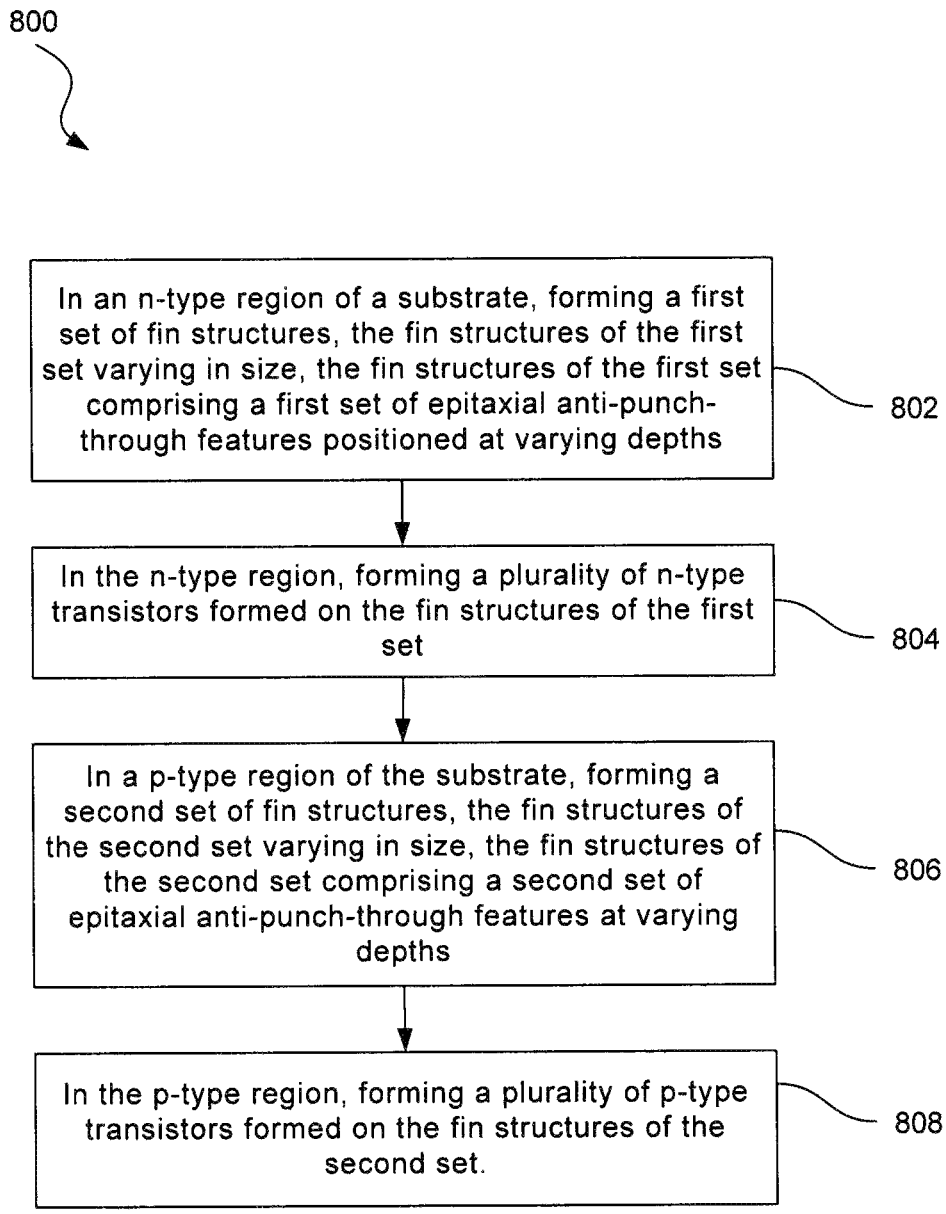
FIG. 8 is a flowchart showing an illustrative method for forming n-type and p-type devices with anti-punch-through features at varying depths, according to one example of principles described herein.

FIG. 8 is a flowchart showing an illustrative method for forming n-type and p-type devices with anti-punch-through features at varying depths. According to the present example, the method 800 includes a step 802 for forming, in an n-type region, a first set of fin structures, the fin structures of the first set varying in size, the fin structures of the first set comprising a first set of epitaxial anti-punch-through features positioned at varying depths. In one example, the epitaxial anti-punch-through features are formed according to the method described above in accordance with FIGS. 5B, 5C, and 5D. Particularly, a removal process is used to remove a portion of the fin structures. Due to the loading effect, the fin structures will have varying heights. Then, an epitaxial growth process is applied to form the epitaxial anti-punch-through features. An additional epitaxial growth process may be applied to form the semiconductor layer above the anti-punch-through features. Additionally, the anti-punch-through features and the semiconductor layer may be doped in-situ.

According to the present example, the method 800 further includes a step 804 for forming, in the n-type region, a plurality of n-type transistors formed on the fin structures of the first set. This may involve forming gate devices on top of the fin structures. Additionally, source and drain regions may be formed on both sides of the gates. Step 804 may correspond to the methods described above in accordance with FIG. 5J with respect to the n-type transistors.

According to the present example, the method 800 further includes a step 806 for forming, in the p-type region, a second set of fin structures, the fin structures of the second set varying in size, the fin structures of the second set comprising a second set of epitaxial anti-punch-through features at varying depths. The second set of fin structures may be formed in a manner that is similar to that of the first set of fin structures. Step 806 may correspond to the methods described above in accordance with FIGS. 5F, 5G, 5H.

According to the present example, the method 800 further includes a step 808 for forming, in the p-type region, a plurality of p-type transistors formed on the fin structures of the second set. This may involve forming gate devices on top of the fin structures. Additionally, source and drain regions may be formed on both sides of the gates. Step 808 may correspond to the methods described above in accordance with FIG. 5J with respect to the p-type transistors.

According to one example, a semiconductor device includes a semiconductor substrate having a first region and a second region. The first region includes a first set of fin structures, the first set of fin structures comprising a first set of epitaxial anti-punch-through features of a first conductivity type. The first region further includes a first set of transistors formed over the first set of fin structures. The second region includes a second set of fin structures, the second set of fin structures comprising a second set of epitaxial anti-punch-through features of a second conductivity type opposite to the first conductivity type. The second region further includes a second set of transistors formed over the second set of fin structures. The first set of epitaxial anti-punch-through features and the second set of epitaxial anti-punch-through features are substantially co-planar.

According to one example, a method includes providing a substrate having a first region and a second region, epitaxially forming a first anti-punch-through layer in the first region of the substrate with in-situ doping of a first conductivity type, epitaxially forming a first semiconductor layer over the first anti-punch-through layer in the first region, epitaxially forming a second anti-punch-through layer in the second region of the substrate with in-situ doping of a second conductivity type, the second anti-punch-through layer being formed co-planar with the first anti-punch-through layer, the second conductivity type being opposite of the first conductivity type, epitaxially forming a second semiconductor layer over the second anti-punch-through layer in the second region, the second semiconductor layer being formed co-planar with the first semiconductor layer, after forming the second semiconductor layer, forming a plurality of isolation features within the substrate, removing an upper portion of the isolated features to form a first set of fin structures in the first region and a second set of fin structures in the second region.

According to one example, a semiconductor device includes an n-type region that includes a first set of fin structures, the fin structures of the first set varying in size, the fin structures of the first set comprising a first set of epitaxial anti-punch-through features positioned at varying depths. The n-type region further includes a plurality of n-type transistors formed on the fin structures of the first set. The semiconductor device further includes a p-type region that includes a second set of fin structures, the fin structures of the second set varying in size, the fin structures of the second set comprising a second set of epitaxial anti-punch-through features at varying depths. The p-type region further includes a plurality of p-type transistors formed on the fin structures of the second set.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a semiconductor substrate having a first region and a second region, both the first region and the second region comprising a plurality of isolation features;
   the first region comprising:

a first set of fin structures separated by the isolation features, the first set of fin structures comprising a first set of epitaxial anti-punch-through features of a first conductivity type, wherein the first set of fin structures comprise a first set of epitaxial semiconductor layers disposed on the first set of epitaxial anti-punch-through features, the first set of epitaxial semiconductor layers being doped at a different doping concentration than the first set of epitaxial anti-punch-through features; and
a first set of transistors formed over the first set of fin structures; and
the second region comprising:
a second set of fin structures separated by the isolation features, the second set of fin structures comprising a second set of epitaxial anti-punch-through features of a second conductivity type opposite to the first conductivity type; and
a second set of transistors formed over the second set of fin structures;
wherein the first set of epitaxial anti-punch-through features and the second set of epitaxial anti-punch-through features are substantially co-planar, and wherein at least a portion of the first and second sets of epitaxial anti-punch-through features extend above top surfaces of the isolation features.

2. The semiconductor device of claim 1, wherein the first set of epitaxial anti-punch-through features comprises one of: silicon germanium (SiGe) or Germanium (Ge).

3. The semiconductor device of claim 1, wherein the first set of epitaxial anti-punch-through features are doped with a p-type dopant.

4. The semiconductor device of claim 1, wherein the second set of epitaxial anti-punch-through features comprise one of: Germanium (Ge) or a III-V semiconductor material.

5. The semiconductor device of claim 1, wherein the second set of epitaxial anti-punch-through features are doped with an n-type dopant.

6. The semiconductor device of claim 1, wherein the first set of epitaxial semiconductor layers comprises silicon (Si).

7. The semiconductor device of claim 1, wherein the second set of fin structures comprises a second set of epitaxial semiconductor layers disposed on the second set of epitaxial anti-punch-through features.

8. The semiconductor device of claim 7, wherein the second set of epitaxial semiconductor layers have a different doping concentration than the first set of epitaxial anti-punch-through features.

9. The semiconductor device of claim 7, wherein the second set of epitaxial semiconductor layers comprise silicon germanium (SiGe).

10. The semiconductor device of claim 1, wherein the first set of epitaxial anti-punch-through features have a different lattice constant than the first set of epitaxial semiconductor layers and the second set of epitaxial anti-punch-through features have a different lattice constant than the second set of semiconductor layers.

11. The semiconductor device of claim 1, wherein the first set of epitaxial anti-punch-through features are differently stressed than the first set of epitaxial semiconductor layers and the second set of epitaxial anti-punch-through features are differently stressed than the second set of epitaxial semiconductor layers.

12. The semiconductor device of claim 1, wherein the first set of epitaxial anti-punch-through features comprise a different semiconductor material than the first set of epitaxial semiconductor layers and the second set of epitaxial anti-punch-through features comprise a different semiconductor material than the second set of epitaxial semiconductor layers.

13. A method comprising:
providing a substrate having a first region and a second region;
epitaxially forming a first anti-punch-through layer in the first region of the substrate with in-situ doping of a first conductivity type;
epitaxially forming a first semiconductor layer over the first anti-punch-through layer in the first region;
after forming the first semiconductor layer, epitaxially forming a second anti-punch-through layer in the second region of the substrate with in-situ doping of a second conductivity type, the second anti-punch-through layer being formed co-planar with the first anti-punch-through layer, the second conductivity type being opposite of the first conductivity type;
epitaxially forming a second semiconductor layer over the second anti-punch-through layer in the second region, the second semiconductor layer being formed co-planar with the first semiconductor layer;
after forming the second semiconductor layer, forming a plurality of isolation features within the substrate;
removing an upper portion of the isolated features to form a first set of fin structures in the first region and a second set of fin structures in the second region such that at least a portion of the first and second anti-punch-through layers are exposed.

14. The method of claim 13, further comprising, forming transistors on the first set of fin structures and the second set of fin structures.

15. The method of claim 13, wherein the forming a plurality of isolation features within the substrate includes:
performing a process to form trenches through the first anti-punch-through layer and the first semiconductor layer and forming second trenches through the second anti-punch-through layer and the second semiconductor layer;
filling in a dielectric material in the trenches; and
performing a planarizing process to the dielectric material.

16. A semiconductor device comprising:
an n-type region comprising:
a first set of fin structures separated by a first set of isolation features, the fin structures of the first set varying in size, the fin structures of the first set comprising a first set of epitaxial anti-punch-through features positioned at varying depths, wherein the first set of fin structures comprise a first set of epitaxial semiconductor layers disposed on the first set of epitaxial anti-punch-through features, the first set of epitaxial semiconductor layers being doped at a different doping concentration than the first set of epitaxial anti-punch-through features; and
a plurality of n-type transistors formed on the fin structures of the first set; and
a p-type region comprising:
a second set of fin structures separated by a second set of isolation features, the fin structures of the second set varying in size, the fin structures of the second set comprising a second set of epitaxial anti-punch-through features at varying depths; and
a plurality of p-type transistors formed on the fin structures of the second set;

wherein at least a portion of the first and second sets of epitaxial anti-punch-through features extend above top surfaces of the first and second sets of epitaxial anti-punch-through features.

17. The semiconductor device of claim 16, wherein the first set of epitaxial anti-punch-through features are doped with a p-type dopant.

18. The semiconductor device of claim 16, wherein the second set of epitaxial anti-punch-through features are doped with an n-type dopant.

19. The semiconductor device of claim 16, wherein the second set of fin structures comprise a second set of epitaxial semiconductor layers disposed on the second set of epitaxial anti-punch-through features.

20. The semiconductor device of claim 19, wherein the second set of epitaxial semiconductor layers are doped at a different doping concentration than the second set of epitaxial anti-punch-through features.

* * * * *